(12) United States Patent
Yamauchi et al.

(10) Patent No.: US 7,651,625 B2
(45) Date of Patent: Jan. 26, 2010

(54) CATALYST-AIDED CHEMICAL PROCESSING METHOD AND APPARATUS

(75) Inventors: Kazuto Yamauchi, Osaka (JP); Yasuhisa Sano, Osaka (JP); Hideyuki Hara, Osaka (JP); Junji Murata, Osaka (JP); Keita Yagi, Tokyo (JP)

(73) Assignees: Osaka University, Osaka (JP); Ebara Corporation, Tokyo (JP)

( * ) Notice: Subject to any disclaimer, the term of this patent is extended or adjusted under 35 U.S.C. 154(b) by 0 days.

(21) Appl. No.: 11/892,780

(22) Filed: Aug. 27, 2007

(65) Prior Publication Data
US 2008/0073222 A1    Mar. 27, 2008

(30) Foreign Application Priority Data

| Aug. 28, 2006 | (JP) | ............................. 2006-231095 |
| Oct. 18, 2006 | (JP) | ............................. 2006-283781 |
| Dec. 5, 2006 | (JP) | ............................. 2006-328287 |
| Dec. 5, 2006 | (JP) | ............................. 2006-328331 |
| Dec. 5, 2006 | (JP) | ............................. 2006-328515 |

(51) Int. Cl.
*B44C 1/22* (2006.01)

(52) U.S. Cl. ............................. 216/83; 216/88; 216/89; 205/640

(58) Field of Classification Search ................... 216/83, 216/88, 89
See application file for complete search history.

(56) References Cited

FOREIGN PATENT DOCUMENTS

JP    2006-114632    4/2006

OTHER PUBLICATIONS

Non-published U.S. Appl. No. 11/401,315.
Partial European Search Report issued Nov. 2, 2009 in corresponding European Application No. 07016757.

*Primary Examiner*—Shamim Ahmed
(74) *Attorney, Agent, or Firm*—Wenderoth, Lind & Ponack, L.L.P.

(57) ABSTRACT

A catalyst-aided chemical processing method can process hard-to-process materials, especially SiC, GaN, etc. whose importance as electronic device materials is increasing these days, with high processing efficiency and high precision even for a space wavelength range of not less than several tens of μm. The catalyst-aided chemical processing method comprises: putting a workpiece in a processing liquid in which halogen-containing molecules are dissolved; and moving the workpiece and a catalyst composed of molybdenum or a molybdenum compound relative to each other while keeping the catalyst in contact with or close proximity to a surface to be processed of the workpiece, thereby processing the surface of the workpiece.

20 Claims, 28 Drawing Sheets

FIG. 30
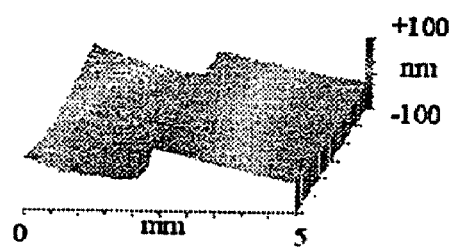
FIG. 31A  FIG. 31B
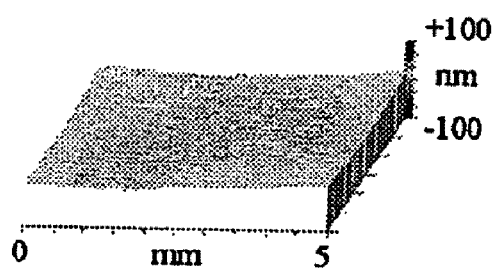 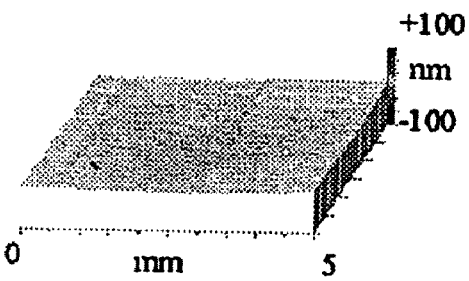
FIG. 31C
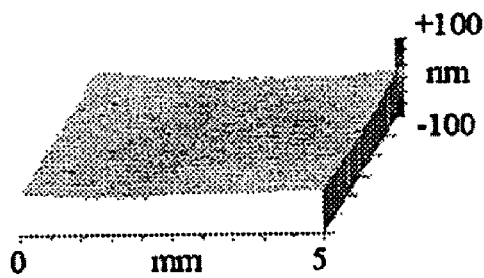

(PV:360nm, rms:5.69nm, Ra:4.24nm)

(P-V:4.97nm, rms:0.84nm, Ra:0.68nm)

(P-V:23.9nm, rms:3.11nm, Ra:2.51nm)

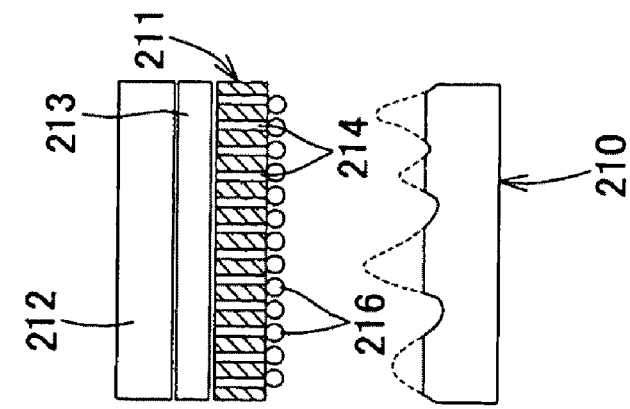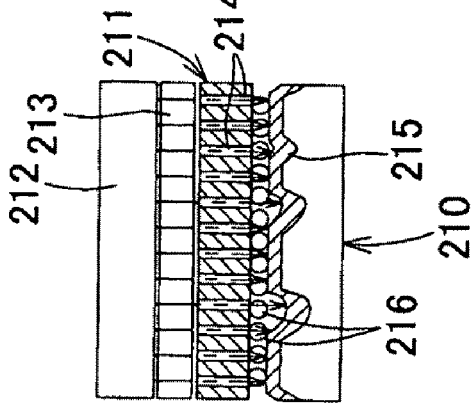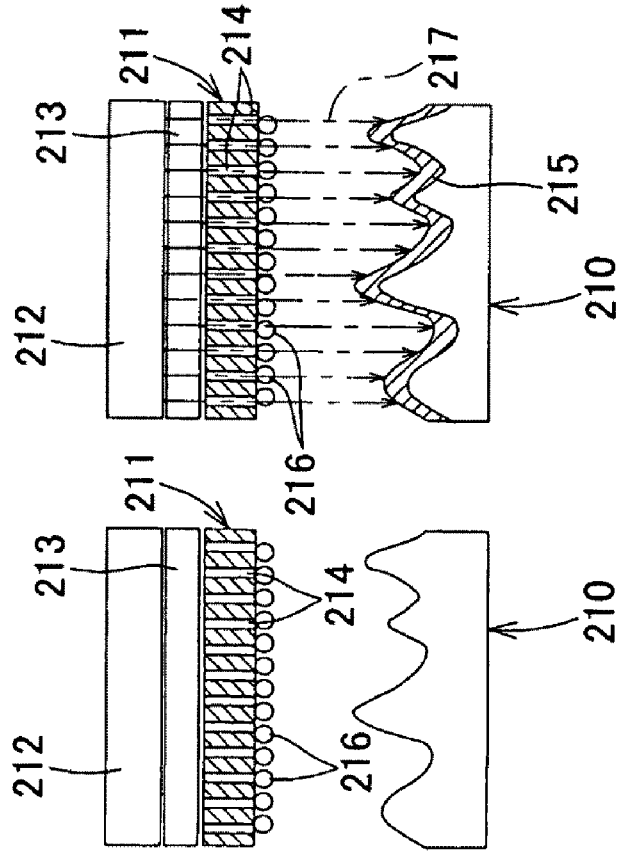
FIG. 45A  FIG. 45B  FIG. 45C  FIG. 45D

CATALYST-AIDED CHEMICAL PROCESSING METHOD AND APPARATUS

BACKGROUND OF THE INVENTION

1. Field of the Invention

The present invention relates to a catalyst-aided chemical processing method and apparatus, and more particularly to a catalyst-aided chemical processing method and apparatus for processing a workpiece by utilizing a catalytic action capable of chemical reaction.

2. Description of the Related Art

Mechanical processing methods have long been used in various fields. A mechanical polishing method, for example, involves pressing a tool against a surface to be processed so as to process the surface by creating material defects in the surface and taking away surface atoms through a mechanical action. Such a mechanical polishing method causes damage to a crystal lattice and, in addition, can hardly provide a high-accuracy processed surface. In order to process a workpiece with high accuracy, it is necessary to use a chemical processing method which can process the workpiece without producing a lattice defect in it.

A processing method called EEM (elastic emission machining) is known which involves allowing a suspension of ultrafine powder to flow along a surface to be processed of a workpiece so as to bring the ultrafine powder into contact with the surface to be processed, without applying a substantial load on it, and processing the surface to be processed by removing surface atoms of the surface to be processed on the order of atomic unit through an interaction (sort of chemical bonding) between the ultrafine powder and the surface to be processed (see, for example, Japanese Patent Laid-Open Publication No. 2000-167770, and Japanese Patent Publications Nos. H2-25745, H7-16870 and H6-44989).

Further, plasma CVM (chemical vaporization machining) has been proposed which is a processing method comprising supplying a neutral radical, which has been produced by decomposition of a reactive gas caused by high-voltage application to a processing electrode, to a surface to be processed of a workpiece while moving the processing electrode relative to the surface to be processed, thereby processing the surface to be processed through vaporization and removal of a volatile compound produced by a radical reaction between the neutral radical and an atom or a molecule of the surface to be processed (see, for example, Japanese Patent No. 2962583). Upon the processing, the processing time is numerically controlled based on processing time-processing amount correlation data, determined by the type of the reactive gas and the material of the workpiece, and also on coordinate data regarding a pre-processed surface and an intended post-processed surface, and according to the coordinate difference.

A high-efficiency processing method utilizing a high-density radical reaction has also been proposed which involves rotating a rotary electrode at a high speed to bring in a gas with the surface of the rotating electrode, thereby creating a flow of the gas that passes through a processing gap (see, for example, Japanese Patent No. 3069271).

The above-described EEM and plasma CVM are both excellent chemical processing methods. The EEM method can provide a flat processed surface at an atomic level. High-efficiency processing, comparable to mechanical processing, can be performed with high accuracy by plasma CVM.

As will be appreciated from the processing principle of EEM, it is possible with EEM to obtain a very flat processed surface for a high-frequency space wavelength. In EEM, fine particles of, e.g., $SiO_2$ are supplied by ultrapure water to a surface to be processed of a workpiece, and processing progresses through chemical bonding between surface atoms of the fine particles and surface atoms of the workpiece. It would appear that the surfaces of the fine particles constitute a very flat plane and the flat plane will be transferred as a reference plane to the surface to be processed. It is therefore possible to obtain a flat processed surface at an atomic level without disordering atomic arrangement. Because of the processing principle, however, it is difficult with EEM to flatten a surface of a space wavelength range of not less than several tens of μm.

Because of the use of an active radical, plasma CVM is a high-efficiency processing method. Plasma CVM utilizes a chemical reaction between neutral radicals in a plasma and the surface of a workpiece. In particular, processing is carried out by generating a high-density plasma in a high-pressure atmosphere of 1 atm and causing neutral radicals generated in the plasma to act on surface atom of a workpiece to convert the atoms into a volatile substance. Plasma CVM can thus process a surface to be processed with a high processing efficiency, comparable to conventional mechanical processing, without entailing disorder of atomic arrangement in the surface to be processed. With no reference plane, however, the processing is likely to be affected by the plane index, lattice defects, etc. of the processing surface.

Chemical mechanical polishing (CMP), on the other hand, uses abrasive grains of, for example, $SiO_2$ or $Cr_2O_3$, and is directed to forming a non-disturbed processed surface by utilizing a chemical action and thus with a less mechanical action. For example, Japanese Patent No. 3734722 discloses a method which comprises immersing a diamond film in an oxidizing polishing liquid in which abrasive grains, having catalytic oxidizing properties, are dispersed, and polishing the diamond film while rubbing the surface of the film with the abrasive grains. The patent document discloses the use of chromium oxide or iron oxide as the abrasive grains and the use of a polishing liquid comprising a dispersion of the abrasive grains in a hydrogen peroxide solution, or an aqueous nitrate solution or a mixture thereof. Because of the mechanical factor of CMP, however, it is not possible with CMP to completely remove a denatured processed layer. In addition, CMP can hardly be employed for processing of a material having a low mechanical rigidity.

A processing method has been proposed which comprises putting a workpiece in a processing liquid, in particular a hydrohalic acid, bringing a solid catalyst composed of platinum, gold or a ceramic material into contact with or close proximity to a surface to be processed of the workpiece, and dissolving in the processing liquid a halogen compound formed by a chemical reaction between a halogen radical and a surface atom of the workpiece, the halogen radical being generated by the dissociation of a hydrogen halide molecule at the surface of the catalyst, thereby processing the workpiece (see, for example, Japanese Patent Laid-Open Publication No. 2006-114632). However, there exist materials that cannot be processed with a halogen radical. GaN, for example, is stable in hydrofluoric acid and thus cannot be processed with a halogen radical (fluorine radical). Hydrofluoric acid cannot be used for processing of copper because copper corrodes rapidly in hydrofluoric acid.

It is known that surface atoms of a workpiece can be ionized and etched away by immersing the workpiece in a processing liquid comprising a mixture of an oxidizing solution and an acidic or basic solution suited for the metal material of the workpiece. According to this processing method, a surface to be processed of a workpiece is etched away uniformly, that is, a surface roughness of the processed surface cannot be improved. Thus, it is generally difficult with this method to process a surface into a flat processed surface. This method also involves the problem that an etching reaction progresses even after processing due to a processing liquid remaining on the workpiece. Replacement of the remaining processing liquid, e.g., with ultrapure water immediately after processing is therefore needed.

SUMMARY OF THE INVENTION

In view of the above situation, it is an object of the present invention to offer a new processing method which can process hard-to-process materials, especially SiC, GaN, etc. whose importance as electronic device materials is increasing these days, with high processing efficiency and high precision even for a space wavelength range of not less than several tens of μm. The processing method should be a chemical processing method from a crystallographical viewpoint, because a mechanical processing method entails production of a lattice defect in a surface to be processed of a workpiece, which makes it difficult to process the workpiece with high precision. The present invention utilizes the principle of transferring a reference plane through a chemical reaction. It is important that the reference plane not change, because if the reference plane changes, the surface to be processed of a workpiece also changes with the progress of processing. Accordingly, the present invention offers a catalyst-aided chemical processing method and apparatus that entails no change of a reference plane and utilizes a catalytic action capable of chemical reaction.

In order to achieve the above object, the present invention provides a catalyst-aided chemical processing method comprising: putting a workpiece in a processing liquid in which halogen-containing molecules are dissolved; and moving the workpiece and a catalyst composed of molybdenum or a molybdenum compound relative to each other while keeping the catalyst in contact with or close proximity to a surface to be processed of the workpiece, thereby processing the surface to be processed of the workpiece.

The processing liquid preferably is hydrofluoric acid (aqueous HF solution). The workpiece is preferably composed of a material selected from Si, SiC, GaN, sapphire, ruby and diamond.

In a preferred aspect of the present invention, the surface to be processed of the workpiece is processed and flattened by moving the workpiece, held by a holder, and a flat platen having a surface comprised of the catalyst relative to each other while keeping the surface of the platen in contact with or close proximity to the surface to be processed of the workpiece in the presence of the processing liquid.

The present invention provides another catalyst-aided chemical processing method comprising: putting a workpiece in a processing liquid in which halogen-containing molecules are dissolved; and bringing a catalyst, composed of platinum, gold, a ceramic solid catalyst, molybdenum or a molybdenum compound, into contact with or close proximity to a surface to be processed of the workpiece, thereby processing the workpiece; wherein at least one of a voltage application process for applying a voltage between the surface to be processed of the workpiece and the catalyst during the processing, a light irradiation process for irradiating the surface to be processed of the workpiece with light during or before the processing, a workpiece temperature control process for controlling the temperature of the workpiece during the processing, a processing liquid temperature control process for controlling the temperature of the processing liquid, and a catalyst temperature control process for controlling the temperature of the catalyst is carried out, either singly or in a combination of two or more, in the processing of the workpiece.

The application of a voltage between a surface to be processed of a workpiece and a catalyst during processing can assist in the dissociation reaction of a halogen-containing molecule, thereby increasing the amount of halogen atoms generated at the surface of the catalyst and increasing the processing rate.

The surface to be processed of the workpiece can be activated and the processing rate can be increased by irradiating the surface to be processed with light during or before processing to light-excite the surface.

As is known by the Arrhenius equation, the higher the reaction temperature of a chemical reaction is, the higher is the reaction rate. It is therefore possible to control or change the processing rate of a workpiece by controlling the reaction temperature of a chemical reaction involved in the processing. The reaction temperature can be controlled by controlling at least one of the temperature of the workpiece, the temperature of the processing liquid and the temperature of the catalyst during the processing of the workpiece.

The present invention also provides a catalyst-aided chemical processing apparatus comprising: a platen having a surface comprised of a catalyst composed of molybdenum or a molybdenum compound; a holder for holding a workpiece and bringing a surface to be processed of the workpiece into contact with the platen; a processing liquid supply section for supplying a processing liquid, in which halogen-containing molecules are dissolved, between the platen and the workpiece held by the holder and kept in contact with the platen; and a drive section for moving the platen and the workpiece, held by the holder and kept in contact with the platen, relative to each other.

The present invention also provides another catalyst-aided chemical processing apparatus comprising: a platen having a surface comprised of a catalyst composed of platinum, gold, a ceramic solid catalyst, molybdenum or a molybdenum compound; a holder for holding a workpiece and bringing a surface to be processed of the workpiece into contact with the platen; a processing liquid supply section for supplying a processing liquid, in which halogen-containing molecule are dissolved, between the platen and the workpiece held by the holder and kept in contact with the platen; a drive section for moving the platen and the workpiece, held by the holder and kept in contact with the platen, relative to each other; and at least one of a power source for applying a voltage between the surface to be processed of the workpiece and the catalyst, a light source for irradiating the surface to be processed of the workpiece with light, a workpiece temperature control mechanism for controlling the temperature of the workpiece during processing, a processing liquid temperature control mechanism for controlling the temperature of the processing liquid, and a catalyst temperature control mechanism for controlling the temperature of the catalyst.

The present invention also provides yet another catalyst-aided chemical processing method comprising: putting a workpiece in an oxidizing processing liquid; bringing a solid catalyst, having an acidic or basic nature, into contact with or close proximity to a surface to be processed of the workpiece; and dissolving surface atoms of the surface to be processed, which is in contact with or close proximity to the solid catalyst, in the oxidizing processing liquid, thereby processing the surface to be processed.

The oxidizing processing liquid oxidizes a surface to be processed of a workpiece, and the solid catalyst having an acidic or basic nature exhibits acidic or basic properties only at the surface. Especially when using an oxidizing solution in which a workpiece in the normal state is insoluble or hardly soluble, the surface to be processed of the workpiece is oxidized by the oxidizing processing liquid to form an oxide film, and an etching reaction progresses only in those portion of the oxidized surface to be processed which are in contact with or close proximity to the solid catalyst. This enables processing and flattening utilizing a surface of a solid catalyst as a reference plane.

The oxidizing processing liquid preferably is ozone water or a hydrogen peroxide solution.

When ozone water or a hydrogen peroxide solution is used as an oxidizing processing liquid, a workpiece in the normal state is insoluble or hardly soluble in the oxidizing processing liquid. The use of a higher ozone or hydrogen peroxide concentration of the processing liquid provides a higher oxidation rate for the workpiece. The ozone or hydrogen peroxide concentration of the processing liquid is preferably determined such that the rate of oxidation by the processing liquid is lower than the rate of etching by the solid catalyst. This makes it possible to remove an oxide as soon as it is formed in the surface to be processed of the workpiece, thereby preventing pitting corrosion in the surface to be processed of the workpiece and also preventing the surface to be processed from becoming an oxide film. Further, there is no acidic or basic etching solution remaining on the surface to be processed of the workpiece after processing. This can facilitate cleaning of the processed surface and eliminate the need for replacement, e.g., with ultrapure water. Further, the chemical cost and the cost for waste liquid disposal can be considerably reduced.

Preferably, the surface to be processed of the workpiece is irradiated with light during or before the processing of the workpiece.

The oxidation of the surface to be processed of the workpiece can be promoted by irradiating the surface to be processed with light. This can increase the processing rate.

Preferably, at least one of the temperature of the workpiece, the temperature of the oxidizing processing liquid and the temperature of the solid catalyst is controlled during the processing of the workpiece.

As is known by the Arrhenius equation, the higher the reaction temperature of a chemical reaction is, the higher is the reaction rate. It is therefore possible to control or change the processing rate of the workpiece by controlling the reaction temperature of a chemical reaction involved in the processing.

The present invention also provides yet another catalyst-aided chemical processing method comprising: irradiating with light a surface to be processed of a workpiece put in a processing liquid; bringing a solid catalyst, having an acidic or basic nature, into contact with or close proximity to the surface to be processed of the workpiece; and dissolving surface atoms of the surface to be processed, which is in contact with or close proximity to the solid catalyst, in the processing liquid, thereby processing the surface to be processed.

A surface to be processed of a workpiece can be oxidized to form an oxide film in the surface to be processed by irradiating the surface to be processed with light, preferably ultraviolet light. This makes it possible to etch away only those portions of the oxidized surface which are in contact with or close proximity to the solid catalyst. Though an oxidizing processing liquid is preferably used in the present processing method, ultrapure water or oxygen water (ultrapure water having a high concentration of dissolved oxygen) may also be used.

Preferably, at least one of the temperature of the workpiece, the temperature of the processing liquid and the temperature of the solid catalyst is controlled during the processing of the workpiece.

Preferably, a voltage is applied between the surface to be processed of the workpiece and the solid catalyst during the processing of the workpiece.

The oxidation of the surface to be processed of the workpiece can be promoted and the processing rate can be increased by applying a voltage between the surface to be processed and the solid catalyst.

Preferably, the solid catalyst has or forms a processing reference plane, and the configuration or pattern of the processing reference plane is transferred to the surface to be processed of the workpiece.

The solid catalyst is, for example, a non-woven fabric, a resin or a metal, having an ion exchange function.

Preferable examples of materials having an ion exchange function include a non-woven fabric of polyethylene fibers, resins such as fluororesin, PEEK, etc., and oxidation-resistant metal materials such as Pt, Au, etc.

An ion exchange function can be imparted to a non-woven fabric of polyethylene fibers, for example, by graft polymerization. The etching rate for the workpiece can be increased by increasing the ion change capacity of the solid catalyst. The concentration of ozone water or hydrogen peroxide solution, the intensity of irradiating light, the voltage applied and the ion exchange capacity of the solid catalyst are preferably balanced so that an oxide film will not grow on the surface to be processed of the substrate.

In a preferred aspect of the present invention, the solid catalyst is a metal oxide having an acidic or basic nature.

Examples of the solid catalyst ceramics or glass, such as alumina, zirconia and silicon oxide.

It is also possible to disperse the solid catalyst in a powdery form in the oxidizing processing liquid, and to supply the powder to the surface to be processed of the workpiece by a flow of the oxidizing processing liquid.

The present invention provides yet another catalyst-aided chemical processing apparatus comprising: a platen having a surface comprised of a fixed solid catalyst having an acidic or basic nature; a holder for holding a workpiece and bringing a surface to be processed of the workpiece into contact with or close proximity to the surface of the platen; an oxidizing processing liquid supply section for supplying an oxidizing processing liquid between the platen and the workpiece held by the holder and kept in contact with or close proximity to the surface the platen; and a drive section for moving the platen and the workpiece, held by the holder and kept in contact with or close proximity to the platen, relative to each other.

Preferably, the catalyst-aided chemical processing apparatus further comprises a light source for irradiating the surface to be processed of the workpiece with light.

The present invention provides yet another catalyst-aided chemical processing apparatus comprising: a platen having a surface comprised of a fixed solid catalyst having an acidic or basic nature; a holder for holding a workpiece and bringing a surface to be processed of the workpiece into contact with or close proximity to the surface of the platen; a processing liquid supply section for supplying a processing liquid between the platen and the workpiece held by the holder and kept in contact with or close proximity to the surface the platen; a light source for irradiating the surface to be processed of the workpiece with light; and a drive section for moving the platen and the workpiece, held by the holder and kept in contact with or close proximity to the platen, relative to each other.

Preferably, the catalyst-aided chemical processing apparatus further comprises a power source for applying a voltage between the surface to be processed of the workpiece and the solid catalyst.

Preferably, the catalyst-aided chemical processing apparatus further comprises a temperature control mechanism for controlling at least one of the temperature of the workpiece, the temperature of the processing liquid and the temperature of the solid catalyst during processing of the workpiece.

The present invention provides yet another catalyst-aided chemical processing method comprising: putting a workpiece in a processing liquid containing an oxidizing agent; bringing a solid catalyst, capable of decomposing the oxidizing agent, into contact with or close proximity to a surface to be processed of the workpiece; and removing a compound from the workpiece or dissolving the compound in the processing liquid, said compound being formed by a chemical reaction between an active species having a strong oxidizing power, generated on the solid catalyst, and a surface atom of the workpiece, thereby processing the workpiece; wherein at least one of a light irradiation means for irradiating the surface to be processed of the workpiece with light during the processing, a voltage application means for applying a voltage between the surface to be processed of the workpiece and the solid catalyst during the processing, a catalyst temperature control means for controlling the temperature of the catalyst, a workpiece temperature control means for controlling the temperature of the workpiece, and a processing liquid temperature control means for controlling the temperature of the processing liquid is applied, either singly or in a combination of two or more, to the processing of the surface to be processed.

Preferably, a stabilizer for stabilizing the oxidizing agent is added to the processing liquid to control the decomposition rate of the oxidizing agent.

The oxidizing agent preferably is $H_2O_2$ or $O_3$, and the solid catalyst preferably is a transition metal selected from Fe, Ni, Co, Cu, Cr and Ti, a noble metal selected from platinum and gold, a metal oxide ceramic, a glass, such as quartz ($SiO_2$), sapphire ($Al_2O_3$) and zirconia ($ZrO_2$), or a basic solid catalyst, or a combination thereof. The workpiece is preferably composed of crystalline SiC, sintered SiC, GaN, sapphire, ruby or diamond.

Most preferably, the oxidizing agent is $H_2O_2$, the solid catalyst is Fe and the workpiece is composed of SiC, GaN or diamond, and the processing is carried out by utilizing the Fenton reaction.

Further, the use of $H_2O_2$ as the oxidizing agent and sodium silicate as the stabilizer is more effective.

The processing may be carried by dispersing the solid catalyst in a powdery form in the processing liquid containing an oxidizing agent, and supplying the powdery solid catalyst to the surface to be processed of the workpiece by a flow of the processing liquid.

The present invention also provides yet another catalyst-aided chemical processing apparatus comprising: a flat rotary platen having a surface comprised of a solid catalyst capable of decomposing an oxidizing agent; and a holder having a rotating shaft eccentric to the rotating shaft of the platen; wherein a surface to be processed of a workpiece is processed and flattened by supplying a processing liquid containing the oxidizing agent between the surface of the solid catalyst and the surface to be processed of the workpiece, and rotating the workpiece, held by the holder, and the rotary platen while pressing the workpiece against the platen at a predetermined pressure; and wherein at least one of a light irradiation means for irradiating the surface to be processed of the workpiece with light during the processing, a voltage application means for applying a voltage between the surface to be processed of the workpiece and the solid catalyst during the processing, a solid catalyst temperature control means for controlling the temperature of the solid catalyst, a workpiece temperature control means for controlling the temperature of the workpiece, and a processing liquid temperature control means for controlling the temperature of the processing liquid is applied, either singly or in a combination of two or more, to the processing of the surface to be processed.

The present invention also provides yet another catalyst-aided chemical processing apparatus comprising: a processing liquid containing an oxidizing agent and dispersing a solid catalyst, capable of decomposing the oxidizing agent, in a powdery form therein; and a processing liquid supply section for supplying the powdery solid catalyst to a surface to be processed of a workpiece by a flow of the processing liquid; wherein at least one of a light irradiation section for irradiating the surface to be processed of the workpiece with light, a voltage application section for applying a voltage between the surface to be processed of the workpiece and the solid catalyst, a solid catalyst temperature control section for controlling the temperature of the solid catalyst, a workpiece temperature control section for controlling the temperature of the workpiece, and a processing liquid temperature control section for controlling the temperature of the processing liquid is applied, either singly or in a combination of two or more, to processing of the surface to be processed.

A wide band gap material, such as GaN or SiC, is very stable chemically. It is therefore difficult to obtain a sufficiently high processing rate of the material even when it is reacted with hydroxyl radicals. Especially in the case of GaN, because of the very low energy of the valence band, it is not possible with a hydroxyl radical to draw out an electron from the valence band. The processing rate of a workpiece composed of such a material can be increased by irradiating the surface to be processed of the workpiece with light during the reaction so as to activate the surface to be processed. The wavelength of the irradiating light is preferably not more than a wavelength which corresponds to the band gap of the workpiece, for example, not more than 383 nm when processing SiC, because the band gap of 4H—SiC is 3.26 eV, and not more than 365 nm when processing GaN, because the band gap of GaN is 3.42 eV.

It is difficult only with the Fenton reaction at a surface of a transition metal to increase the reaction rate of a workpiece because the reaction rate cannot be controlled. The Fenton reaction is the one-electron reduction reaction of $H_2O_2$ molecule at the surface of a catalyst. It is therefore possible to promote the generation of hydroxyl radicals by applying a voltage between a catalyst platen and a workpiece. It is preferred to apply such a voltage as to make the catalyst a cathode because the reduction reaction is promoted.

As is known by the Arrhenius equation, the higher the reaction temperature of a chemical reaction is, the higher is the reaction rate. The present processing method is based on a chemical reaction. It is therefore possible to control or change the processing rate of a workpiece by controlling the reaction temperature of the chemical reaction. The reaction temperature can be controlled by controlling the temperature of the catalyst, the temperature of the workpiece and/or the temperature of the processing liquid.

Though the above-described light irradiation means, voltage application means and temperature control means may be employed singly to promote a chemical reaction involved in processing, these means may also be employed in a desired combination. In that case, the plurality of means may be employed either simultaneously or at different times.

BRIEF DESCRIPTION OF THE DRAWINGS

FIG. 30 is a perspective view of a surface of a sample after processing in Example 9;

FIGS. 31A through 31C are perspective views of surfaces of samples after processings in Comp. Examples 1 to 3;

FIGS. 45A through 45D are conceptual diagrams illustrating the third catalyst-aided chemical processing method of the present invention utilizing irradiation with light of a surface to be processed of a workpiece, with FIG. 45A showing the state of the workpiece before processing, FIG. 45B showing the state of the workpiece during light irradiation, FIG. 45C showing the state of the workpiece during processing, and FIG. 45D showing the state of the workpiece after processing;

DETAILED DESCRIPTION OF THE PREFERRED EMBODIMENTS

Figure 1A:
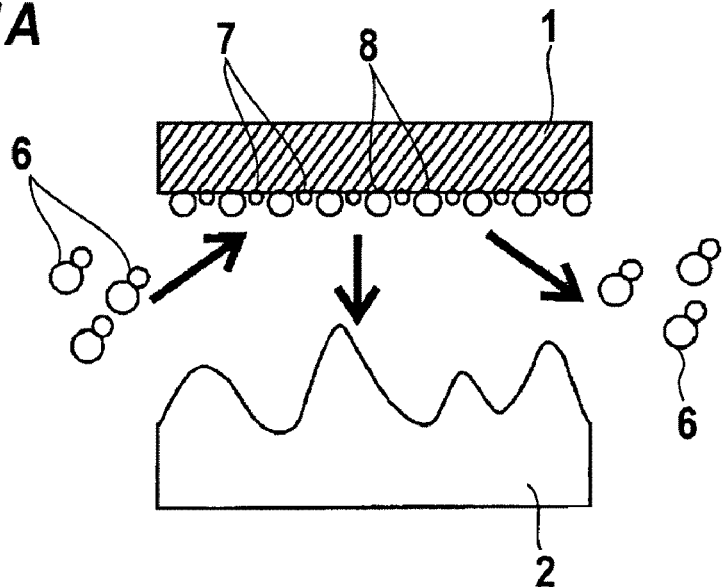
FIGS. 1A through 1C are conceptual diagrams illustrating a first catalyst-aided chemical processing method of the present invention, with FIG. 1A illustrating the dissociation of a halogen-containing molecule and the generation of a halogen radical, a reaction species, at the surface of a molybdenum catalyst put in a processing liquid in which halogen-containing molecules are dissolved, FIG. 1B illustrating the progress of processing of a surface to be processed of a workpiece, which has been brought into contact with or close proximity to the molybdenum catalyst, through dissolution of surface atoms of the workpiece in the processing liquid by a chemical reaction between the surface atoms and the reaction species generated at the surface of the catalyst, and FIG. 1C illustrating the stoppage of the processing reaction upon separation of the molybdenum catalyst from the surface to be processed of the workpiece.
Figure 1B:
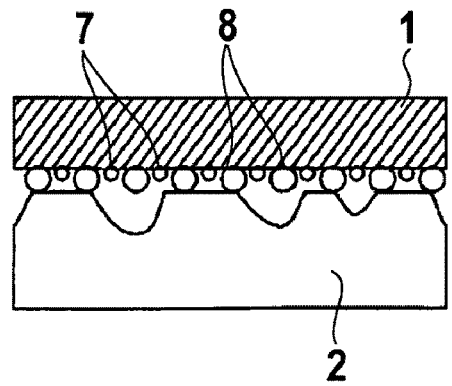
Figure 1C:
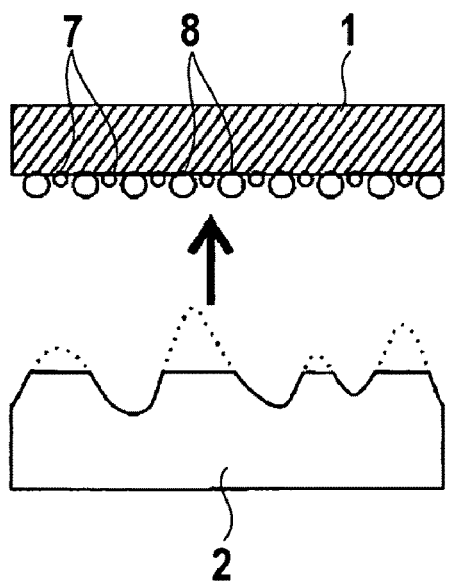

Preferred embodiments of the present invention will now be described with reference to the drawings. FIGS. 1A through 1C illustrate the concept of a first catalyst-aided processing method of the present invention, which comprises processing a surface to be processed of a workpiece by putting the workpiece in a processing liquid containing dissolved halogen-containing molecules, such as hydrofluoric acid (aqueous HF solution), and moving the workpiece and a catalyst composed of molybdenum relative to each other while keeping the catalyst in contact with or close proximity to the surface to be processed of the workpiece.

When a catalyst 1, composed of molybdenum (Mo), is put in a processing liquid in which hydrogen fluoride (HF) 6 is dissolved, the HF 6 is dissociated at the surface of the catalyst 1 to generate H atoms 7 and halogen radicals (F radicals) 8, as shown in FIG. 1A. The F radicals 8 have short lives, but are highly reactive. Accordingly, as shown in FIG. 1B, when the molybdenum (Mo) catalyst 1 is brought into contact with or close proximity to a surface to be processed of a workpiece 2 in hydrofluoric acid (aqueous HF solution), surface atoms of the contact portions of the surface to be processed are dissolved in the processing liquid by chemical reaction. When the catalyst 1 is separated from the surface to be processed of the workpiece 2, as shown in FIG. 1C, the dissolution reaction ceases because the F radicals 8 generated at the surface of the catalyst 1 do not act on the surface of the workpiece 2 any more. Thus, the surface to be processed of the workpiece 2 is processed only when the catalyst 1 is in contact with or in close proximity to the surface to be processed of the workpiece 2.

In the case where the workpiece 2 is composed of SiC, it would appear that the SiC surface is fluorinated by F radicals (F.) and the fluorinated portion is preferentially processed as shown by the following chemical formula (1):

$$SiC + 8F \rightarrow SiF_4\uparrow + CF_4\uparrow \qquad (1)$$

The present catalyst-aided chemical processing method has following three features: (1) Reaction species (halogen radicals) are produced only on a reference plane (catalyst); (2) the reaction species (halogen radicals) become inactive as they leave the reference plane; and (3) the physical properties of the reference plane do not change over a long time period.

Because of these features, the present catalyst-aided chemical processing method has the following advantages: Because of the feature "reaction species are produced only on a reference plane", unlike chemical etching, a surface to be processed can be processed without being influenced by the surface indices of the processing surface. Because of the feature "the reaction species become inactive as they leave the reference plane", the present chemical processing method involves transfer of the reference plane. Atomic-level flattening of a surface to be processed as in EEM can therefore be expected. Because of the feature "the physical properties of the reference plane do not change over a long time period", the reference plane will not change with the progress of processing and with transfer of the reference plane. The present catalyst-aided chemical processing method can therefore be expected to be an efficient ultraprecision processing method.

In addition to the above-described hydrofluoric acid for use as a processing liquid, other hydrogen halide solutions may be used depending on the workpiece, the processing conditions employed, etc. A molybdenum compound may also be used as a catalyst.

Example 1

Figure 2:
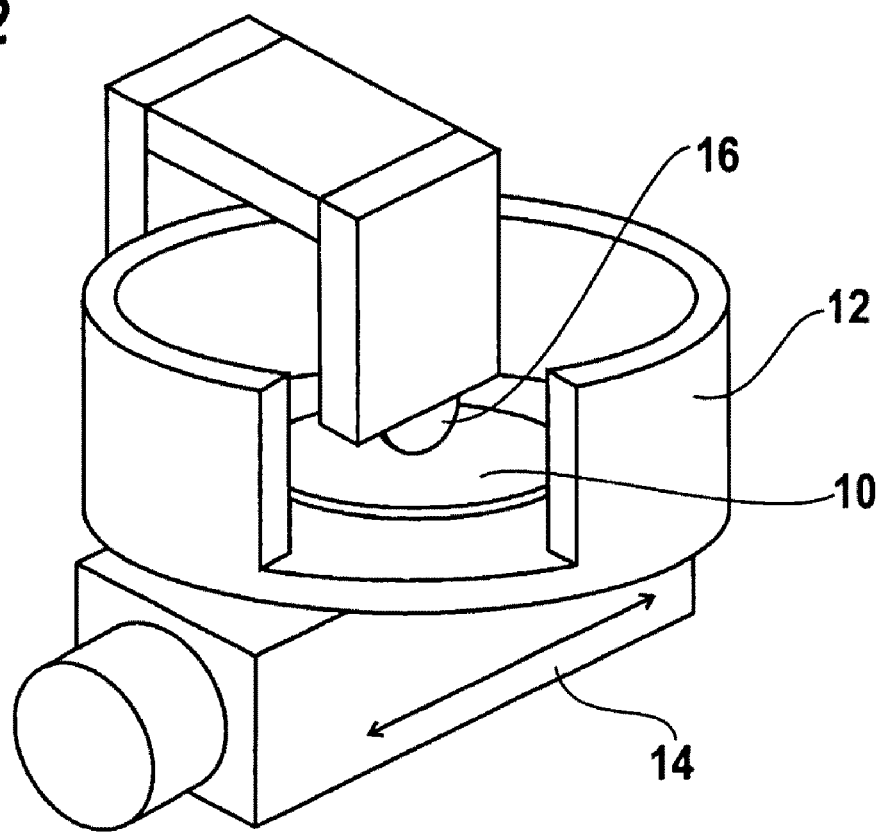
FIG. 2 is a conceptual perspective view of a processing apparatus for basic experiment, adapted to carry out the method shown in FIGS. 1A through 1C.

A processing apparatus was manufactured to confirm the processing principle of the above-described catalyst-aided chemical processing method. FIG. 2 shows a conceptual diagram of the processing apparatus for basic experiment. The processing apparatus includes an upwardly-open chemical tank 12 which has a processing sample 10 fixed on the bottom and which is to be filled with a chemical solution, a drive mechanism 14 for reciprocating the chemical tank 12 in one direction, and a coin-shaped catalyst 16 which is to make contact with a surface (surface to be processed) of the processing sample 10, fixed on the bottom of the chemical tank 12, at a predetermined pressure. The coin-shaped catalyst 16, at the lower end, makes point contact with the surface of the processing sample 10, and the processing sample 10 reciprocates in a horizontal direction, so that the coin-shaped catalyst 16 can in-depth linearly process of the surface of the processing sample 10 (groove processing).

Using molybdenum (Mo) having a purity of 99.95% as a material for the coin-shaped catalyst 16 and hydrofluoric acid (50% HF) as a chemical solution, respectively, the processing sample 10 composed of GaN, immersed in the hydrofluoric acid, was reciprocated at 10 mm/sec while keeping the coin-shaped catalyst 16 in contact with the surface of the processing sample 10, thereby carrying out groove-processing of the surface of the processing sample (GaN) 10 for 3 hours.

Figure 3:
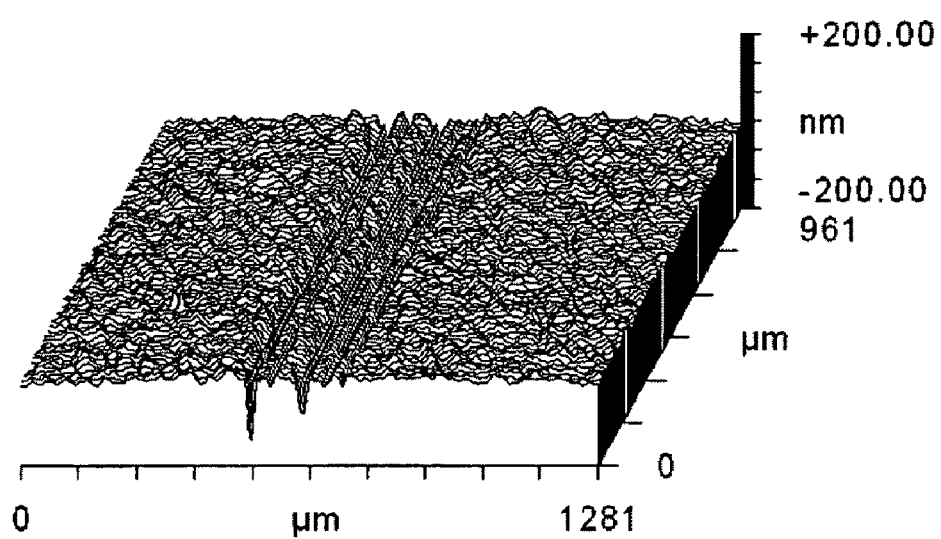
FIG. 3 is a perspective view of a surface of a processing sample after processing in Example 1.
Figure 4:
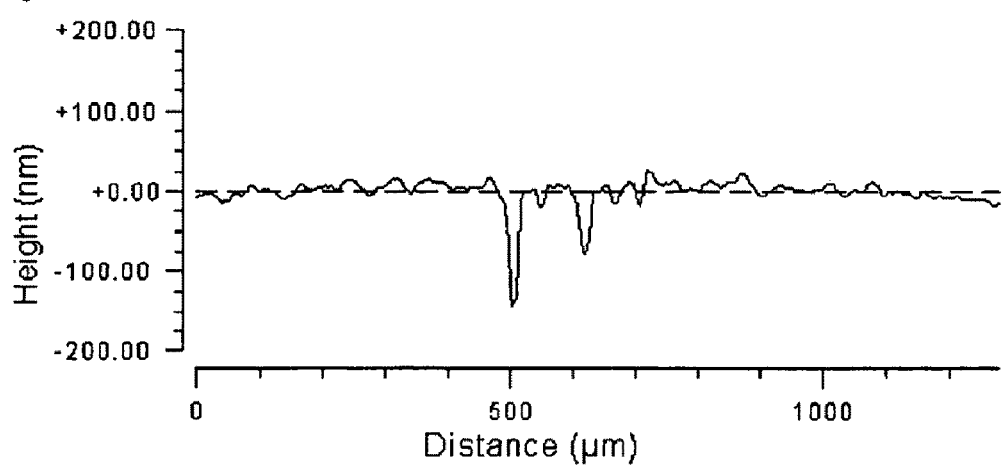
FIG. 4 is a diagram showing a cross-sectional profile of the processing sample after processing in Example 1.

The results of the processing are shown in FIGS. 3 and 4. FIG. 3 shows a perspective view of the surface of the processing sample after processing, and FIG. 4 shows a cross-sectional profile of the processing sample after processing. As shown in FIGS. 3 and 4, there were two linear grooves (recesses) formed in the surface of the GaN processing sample, which grooves had been processed by the contact of the surface to be processed with the coin-shaped molybdenum catalyst. This demonstrates that GaN is processable with the coin-shaped molybdenum catalyst.

Comparative Example 1

Processing of the GaN processing sample 10 was carried out in the same manner as in Example 1 except for using platinum (Pt), having a purity of 99.98%, for the coin-shaped catalyst 16.

Figure 5:
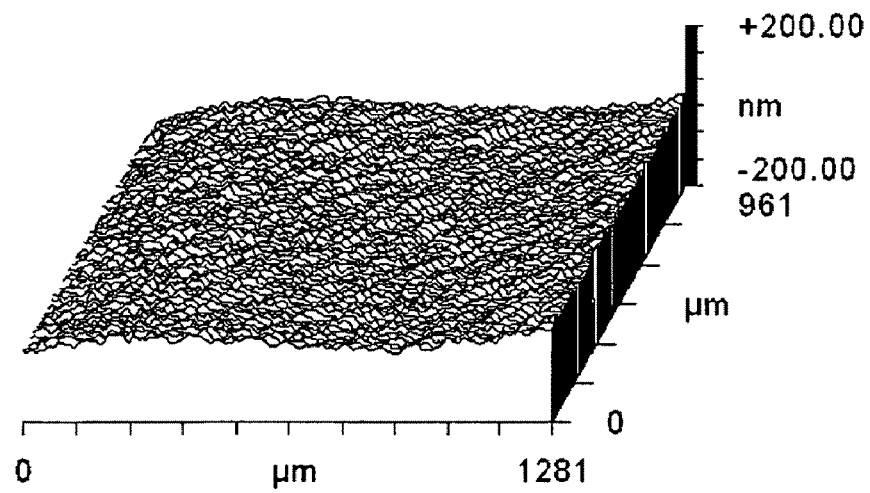
FIG. 5 is a perspective view of a surface of a processing sample after processing in Comp. Example 1.
Figure 6:
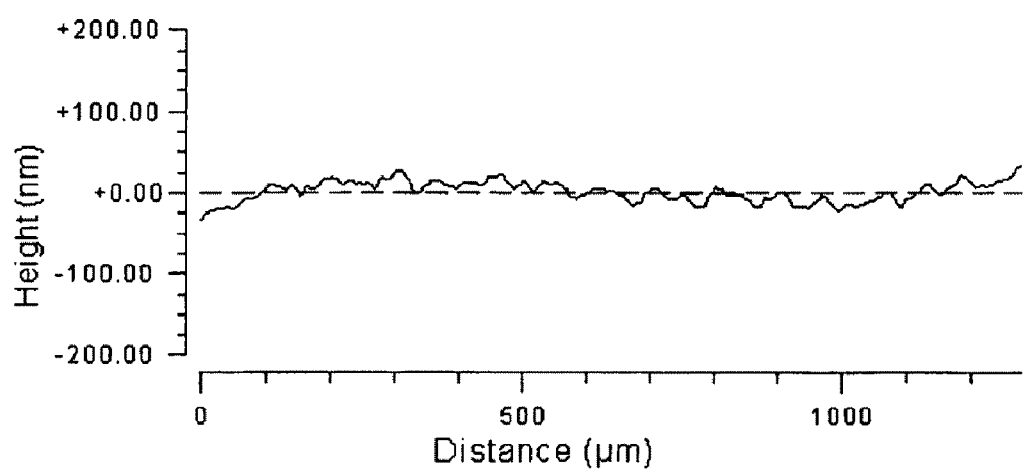
FIG. 6 is a diagram showing a cross-sectional profile of the processing sample after processing in Comp. Example 1.

The results of the processing are shown in FIGS. 5 and 6. FIG. 5 shows a perspective view of the surface of the processing sample after processing, and FIG. 6 shows a cross-sectional profile of the processing sample after processing. As shown in FIGS. 5 and 6, the surface of the GaN processing sample after processing was flat with no groove (recess) formed therein. This demonstrates that GaN is not processable with the coin-shaped platinum catalyst.

It was thus confirmed that the GaN sample, for which chemical etching is generally difficult, can be easily processed only by rubbing it with the molybdenum catalyst in hydrofluoric acid (50% HF). Further, the reference plane of the coin-shaped catalyst is considered to have been transferred because of the fact that the sample was processed only in those portions just under the reference plane of the catalyst. Usefulness of the newly-proposed catalyst-aided chemical processing method was thus confirmed. Since hydrofluoric acid (50% HF) is inexpensive and is relatively easy to handle, this catalyst-aided chemical processing method may be useful also from a practical viewpoint.

F radicals, for example, are highly active, and it is therefore difficult to produce a sufficient amount of F radicals only by dissociation and adsorption by the catalytic action of, e.g., molybdenum. By applying a voltage between a molybdenum catalyst and a workpiece when using hydrofluoric acid (aqueous HF solution) as a processing liquid, the HF dissociation reaction can be promoted to increase the amount of halogen atoms generated at the catalyst surface, thereby increasing the processing rate. When hydrofluoric acid is thus used as a processing liquid, the voltage applied between the molybdenum catalyst and the workpiece is preferably about 3V which corresponds to the standard electrode voltage in the HF decomposition reaction shown by the following reaction formula (2):

$$F_2 + 2H^+ + 2e^- = 2HF + 3.053 \text{ eV} \tag{2}$$

Figure 7A:
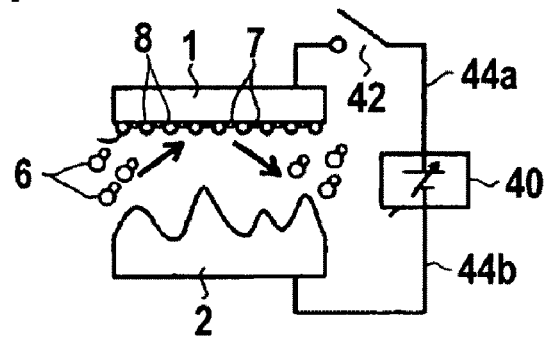
FIGS. 7A through 7D are conceptual diagrams illustrating a variation of the first catalyst-aided chemical processing method of the present invention, FIG. 7A corresponding to FIG. 1A, FIG. 7B illustrating application of a voltage between a catalyst and a workpiece, FIG. 7C corresponding to FIG. 1B, and FIG. 7D corresponding to FIG. 1C.

FIGS. 7A through 7D are conceptual diagrams illustrating a processing method which employs hydrofluoric acid (aqueous HF solution) as a processing liquid and applies a voltage between a catalyst 1 formed of molybdenum (Mo) and a workpiece 2 during processing of a surface of the workpiece 2. As shown in FIG. 7A though 7D, the processing method uses a power source 40 whose anode and cathode are reversible. A conducting wire 44a extending from one pole of the power source 40 and having a switch 42 interposed therein is connected to the catalyst 1, and a conducting wire 44b extending from the other pole of the power source 40 is connected to the workpiece 2. The other features of the present processing method are the same as the processing method illustrated in FIGS. 1A through 1C.

Figure 7B:
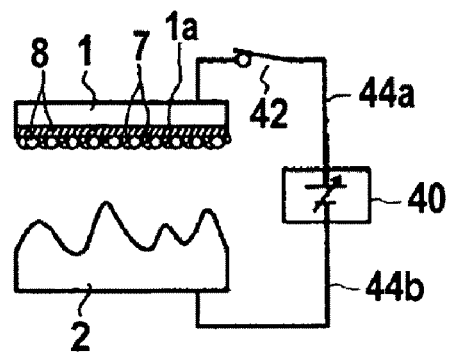
Figure 7C:
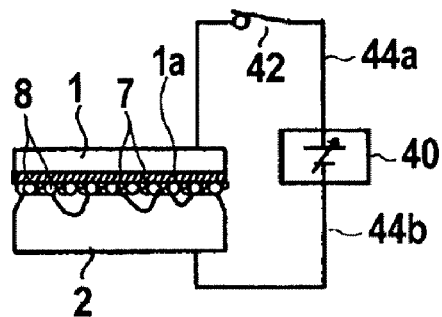

Also in this method, when the catalyst 1 and the workpiece 2 are put in the processing liquid in which hydrogen fluoride (HF) is dissolved, the HF 6 is dissociated at a surface of the catalyst 1 to generate H atoms 7 and halogen radicals (F radicals) 8, as shown in FIG. 7A. When the switch 42 is then turned ON to apply such a voltage between the catalyst 1 and the workpiece 2 as to make the catalyst 1 an anode, as shown in FIG. 7B, the surface (facing the workpiece 2) of the catalyst 1 becomes an activated region 1a and the dissociation reaction of the HF 6 at the surface of the catalyst 1 is promoted to generate a large amount of F radicals 8. When the catalyst 1 is then brought into contact with or close proximity to the surface to be processed of the workpiece 2, as shown in FIG. 7C, surface atoms of the surface to be processed in the contact portions are dissolved in the processing liquid by chemical reaction. The processing of the workpiece 2 is promoted by the activated region 1a of the catalyst 1 where the F radicals are present in a large amount.

Figure 7D:
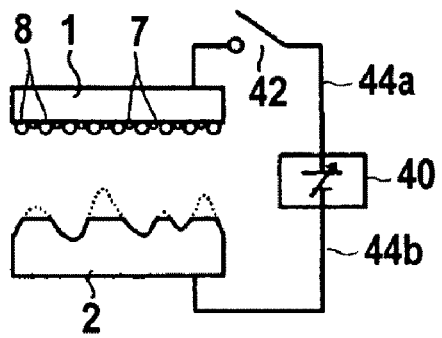

When the catalyst 1 is then separated from the surface to be processed of the workpiece 2, as shown in FIG. 7D, the dissolution reaction ceases because the F radicals generated at the surface of the catalyst 1 do not act on the surface of the workpiece 2 any more. Further, when the switch 42 is turned OFF, the surface of the catalyst 1 is not an activated region anymore. Accordingly, the surface to be processed of the workpiece 2 is processed only when the catalyst 1 is in contact with or in close proximity to the workpiece 2.

Example 2

Figure 8:
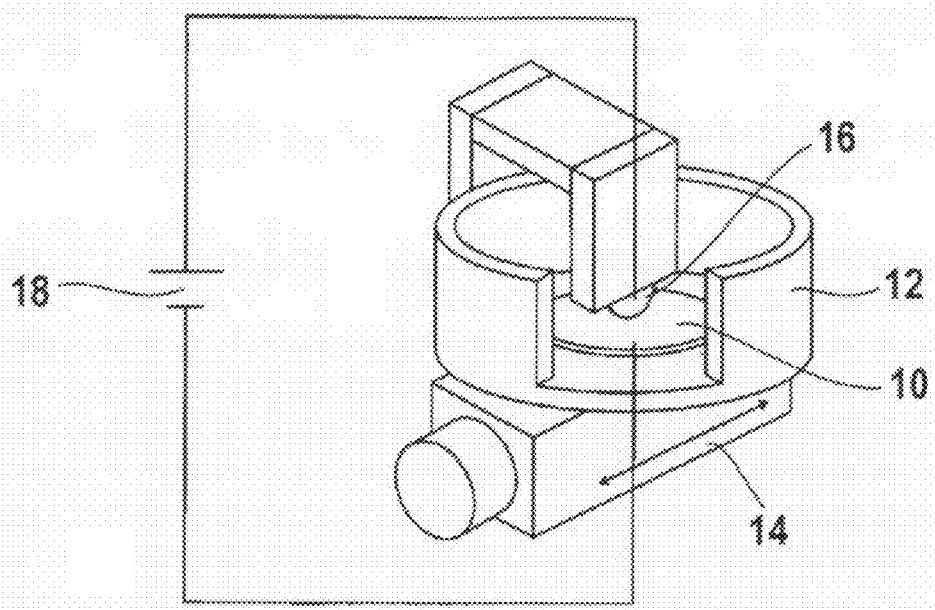
FIG. 8 is a conceptual perspective view of a processing apparatus for basic experiment, adapted to carry out the method shown in FIGS. 7A through 7D.

A processing apparatus was manufactured to confirm the processing principle of the processing method illustrated in FIGS. 7A through 7D. FIG. 8 shows a conceptual diagram of the processing apparatus for basic experiment. This processing apparatus differs from the processing apparatus shown in FIG. 2 in that this apparatus is designed to be capable of applying a voltage between a processing sample 10 and the coin-shaped catalyst 16 by a power source 18. The other constructions of this apparatus are the same as the processing apparatus shown in FIG. 2.

Using molybdenum (Mo) having a purity of 99.95% as a material for the coin-shaped catalyst 16 and hydrofluoric acid (50% HF) as a processing liquid, respectively, the processing sample 10 formed of SiC, immersed in the hydrofluoric acid, was reciprocated at 3 mm/sec while keeping the coin-shaped catalyst 16 in contact with the surface of the processing sample 10 at a load of 74 g, thereby carrying out groove-processing of the surface of the processing sample (SiC) 10 for one hour. During the processing, a voltage of 1V was applied between the processing sample 10 and the coin-shaped catalyst 16 with the coin-shaped catalyst 16 as an anode (Example 2).

Figure 9:
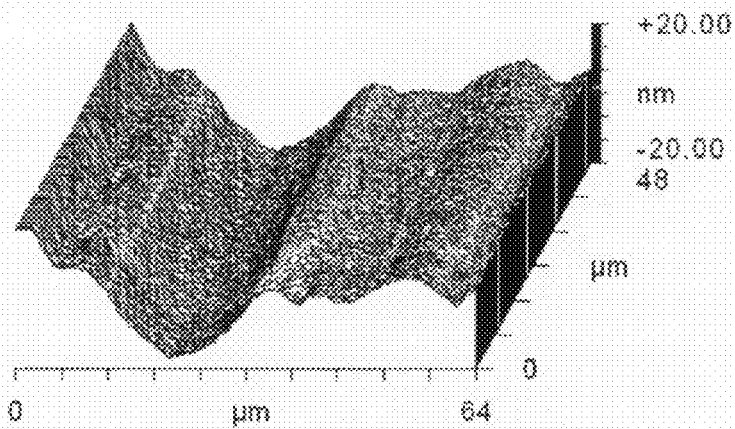
FIG. 9 is a perspective view of a surface of a processing sample after processing in Example 2.
Figure 10:
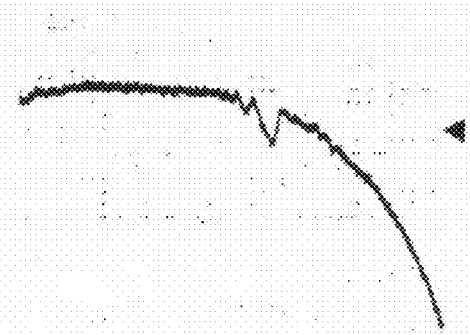
FIG. 10 is a diagram showing a cross-sectional profile of the processing sample after processing in Example 2.
Figure 11:
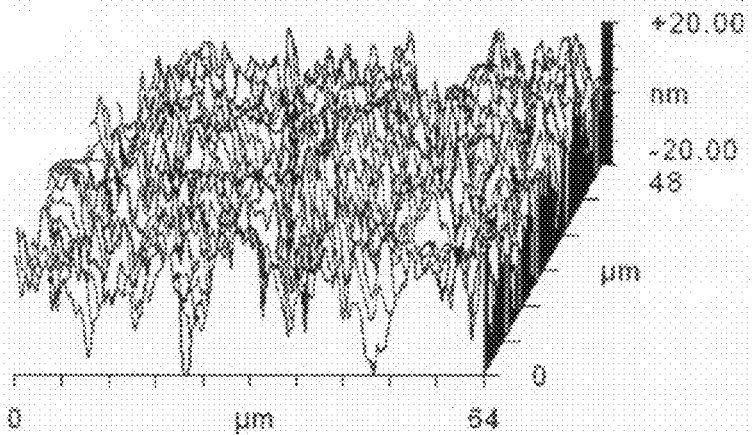
FIG. 11 is a perspective view of the surface of the processing sample before processing.
Figure 12A:
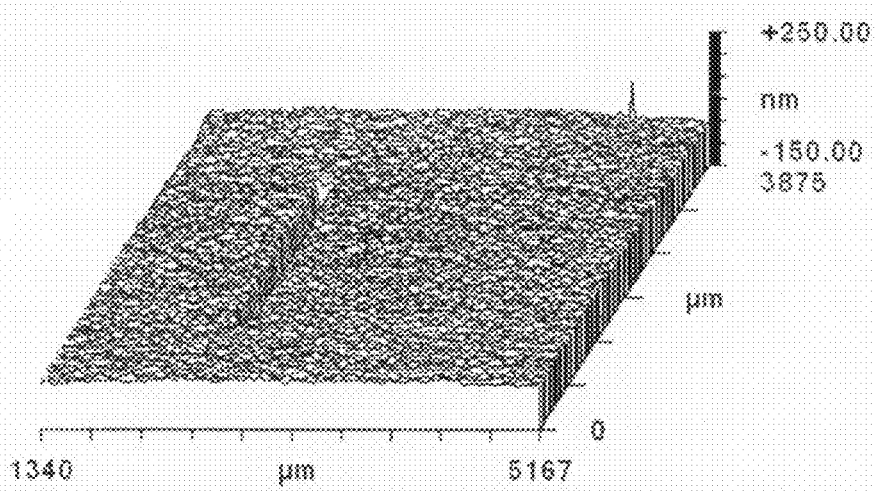
FIG. 12A is a perspective view of a surface of a processing sample (GaN) after processing carried out without applying a voltage between the processing sample and a coin-shaped catalyst.
Figure 12B:
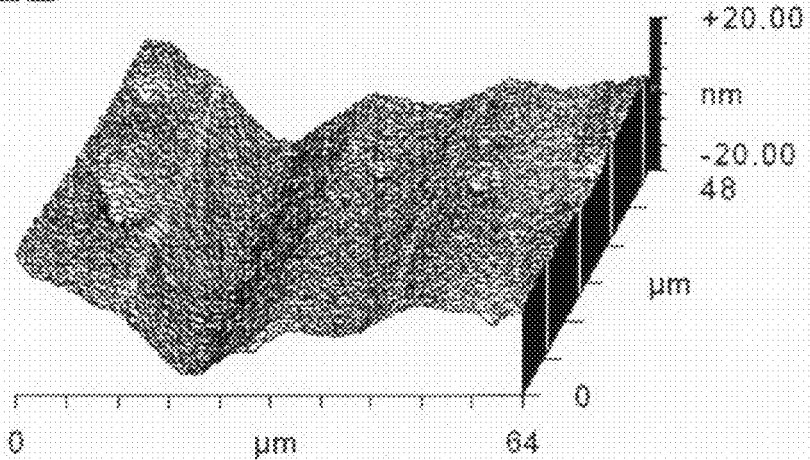
FIG. 12B is an enlarged view of a portion of FIG. 12A.
Figure 13:
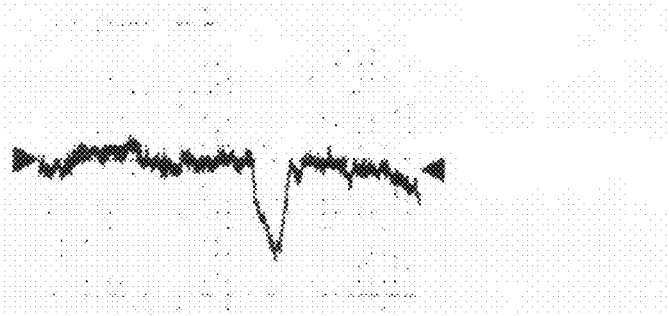
FIG. 13 is a diagram showing a cross-sectional profile of a processing sample (SiC) after processing carried out without applying a voltage between the processing sample and the coin-shaped catalyst.

The results of the processing are shown in FIGS. 9 and 10. FIG. 9 shows a perspective view of the surface of the processing sample after processing, and FIG. 10 shows a cross-sectional profile of the processing sample after processing. A groove having a depth of about 200 nm was processed in the surface of the processing sample. For comparison, processing of the same processing sample 10 was carried out in the same manner but without applying a voltage between the processing sample 10 and the coin-shaped catalyst 16. FIG. 11 shows a perspective view of the surface of the processing sample (SiC) before processing, FIG. 12A shows a perspective view of the surface of the processing sample after processing, FIG. 12B shows an enlarged view of a portion of FIG. 12A, and FIG. 13 shows a cross-sectional profile of the processing sample after processing. A groove having a depth of about 175 nm was processed in the surface of the processing sample.

As will be appreciated from the above results, the processing rate of the SiC processing sample 10 can be increased by applying a voltage of 1V between the processing sample 10 and the coin-shaped catalyst 16 with the coin-shaped catalyst 16 as an anode in carrying out processing of the processing sample 10.

Example 3

Figure 14:
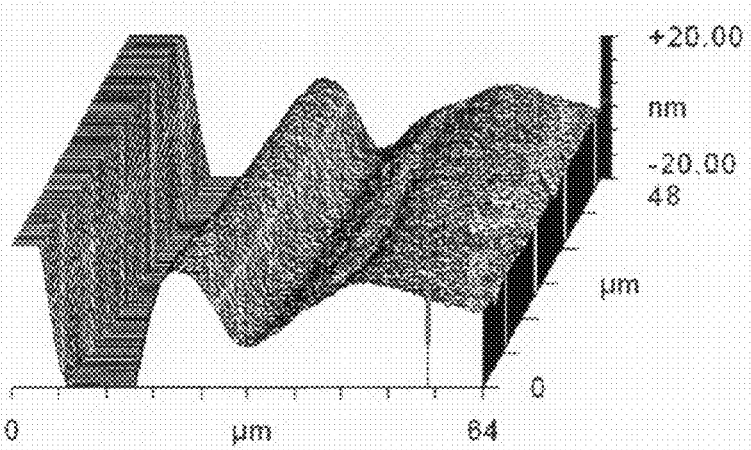
FIG. 14 is a perspective view of a surface of a processing sample after processing in Example 3.
Figure 15:
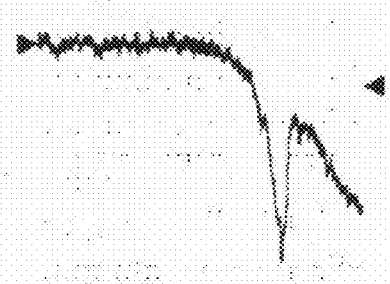
FIG. 15 is a diagram showing a cross-sectional profile of the processing sample after processing in Example 3.

Processing of the surface of the same SiC processing sample 10 was carried out in the same manner as in Example 2 except for applying a voltage of 2V between the processing sample 10 and the coin-shaped catalyst 16 with the coin-shaped catalyst 16 as an anode. The results of the processing are shown in FIGS. 14 and 15. FIG. 14 shows a perspective view of the surface of the processing sample after processing, and FIG. 15 shows a cross-sectional profile of the processing sample after processing. A groove having a depth of about 200 to 250 nm was processed in the surface of the processing sample.

Example 4

Figure 16:
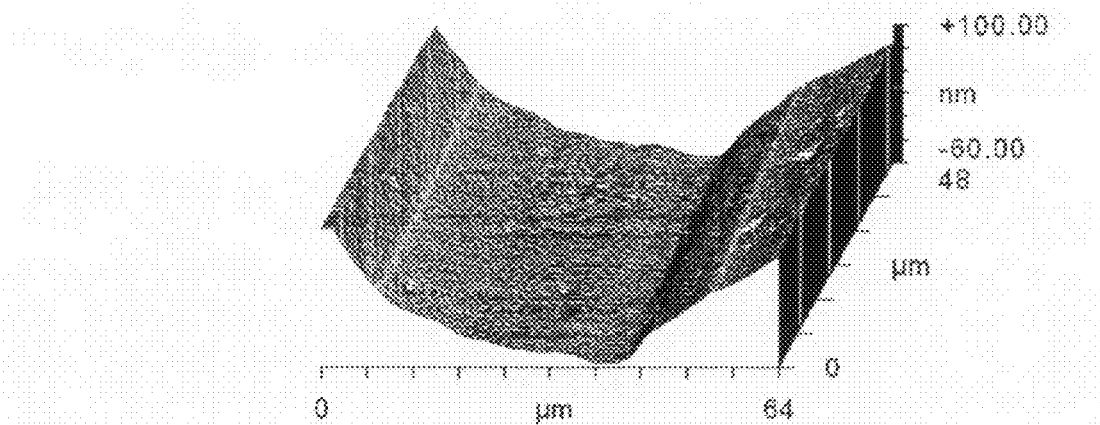
FIG. 16 is a perspective view of a surface of a processing sample after processing in Example 4.
Figure 17:
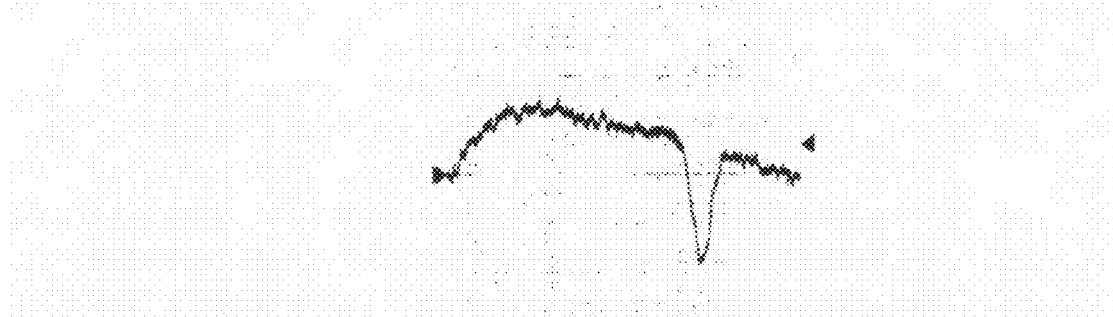
FIG. 17 is a diagram showing a cross-sectional profile of the processing sample after processing in Example 4.

Processing of the surface of the same SiC processing sample 10 was carried out in the same manner as in Example 2 except for applying a voltage of 3V between the processing sample 10 and the coin-shaped catalyst 16 with the coin-shaped catalyst 16 as an anode. The results of the processing are shown in FIGS. 16 and 17. FIG. 16 shows a perspective view of the surface of the processing sample after processing, and FIG. 17 shows a cross-sectional profile of the processing sample after processing. A groove having a depth of about 200 to 250 nm was processed in the surface of the processing sample.

As can be seen from the results of Examples 3 and 4, when carrying out processing of a SiC workpiece using a molybdenum catalyst and an aqueous HF solution as a processing liquid, the voltage applied between the catalyst and the workpiece is preferably about 3V which corresponds to the standard electrode voltage of the HF decomposition reaction.

Example 5

Figure 18:
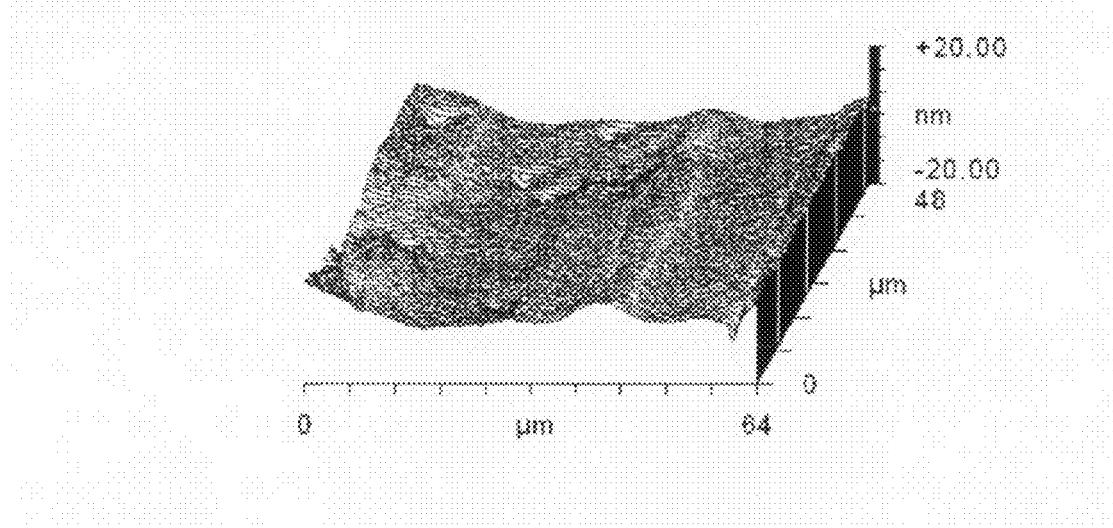
FIG. 18 is a perspective view of a surface of a processing sample after processing in Example 5.
Figure 19:
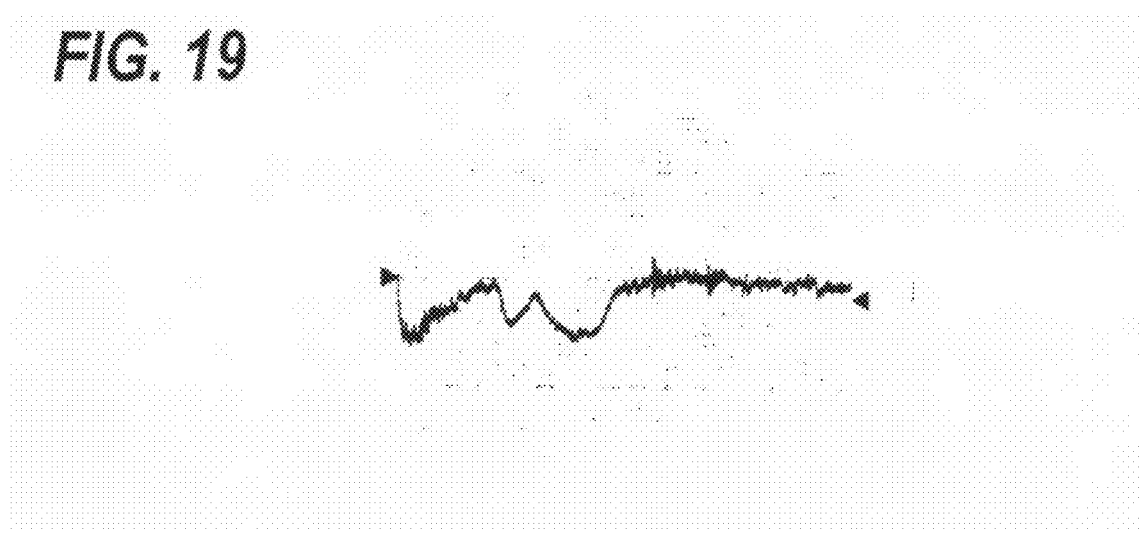
FIG. 19 is a diagram showing a cross-sectional profile of the processing sample after processing in Example 5.

Processing of the surface of the same SiC processing sample 10 was carried out in the same manner as in Example 2 except for applying a voltage of 1V (−1V) between the processing sample 10 and the coin-shaped catalyst 16 with the coin-shaped catalyst 16 as a cathode. The results of the processing are shown in FIGS. 18 and 19. FIG. 18 shows a perspective view of the surface of the processing sample after processing, and FIG. 19 shows a cross-sectional profile of the processing sample after processing. A groove having a depth of about 100 nm was processed in the surface of the processing sample.

Example 6

Figure 20:
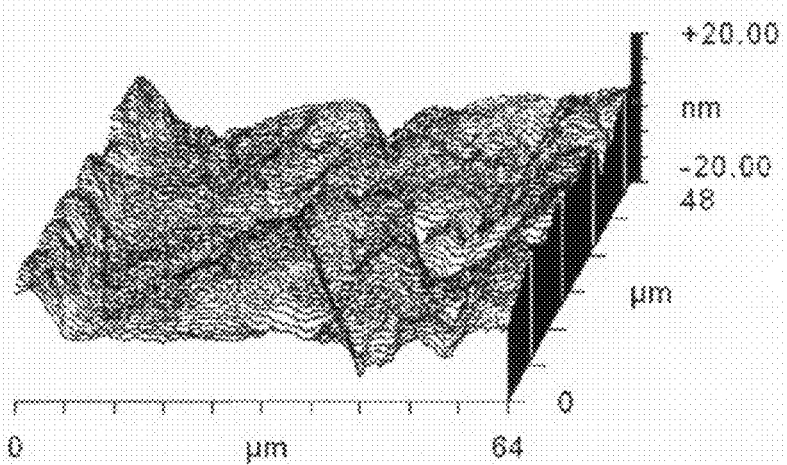
FIG. 20 is a perspective view of a surface of a processing sample after processing in Example 6.
Figure 21:
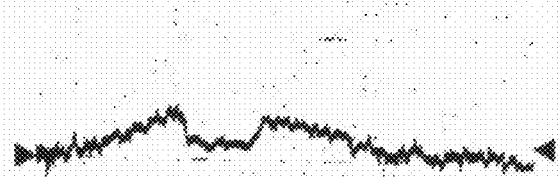
FIG. 21 is a diagram showing a cross-sectional profile of the processing sample after processing in Example 6.

Processing of the surface of the same SiC processing sample 10 was carried out in the same manner as in Example 2 except for applying a voltage of 2V (−2V) between the processing sample 10 and the coin-shaped catalyst 16 with the coin-shaped catalyst 16 as a cathode. The results of the processing are shown in FIGS. 20 and 21. FIG. 20 shows a perspective view of the surface of the processing sample after processing, and FIG. 21 shows a cross-sectional profile of the processing sample after processing. A groove having a depth of about 80 nm was processed in the surface of the processing sample.

Example 7

Figure 22:
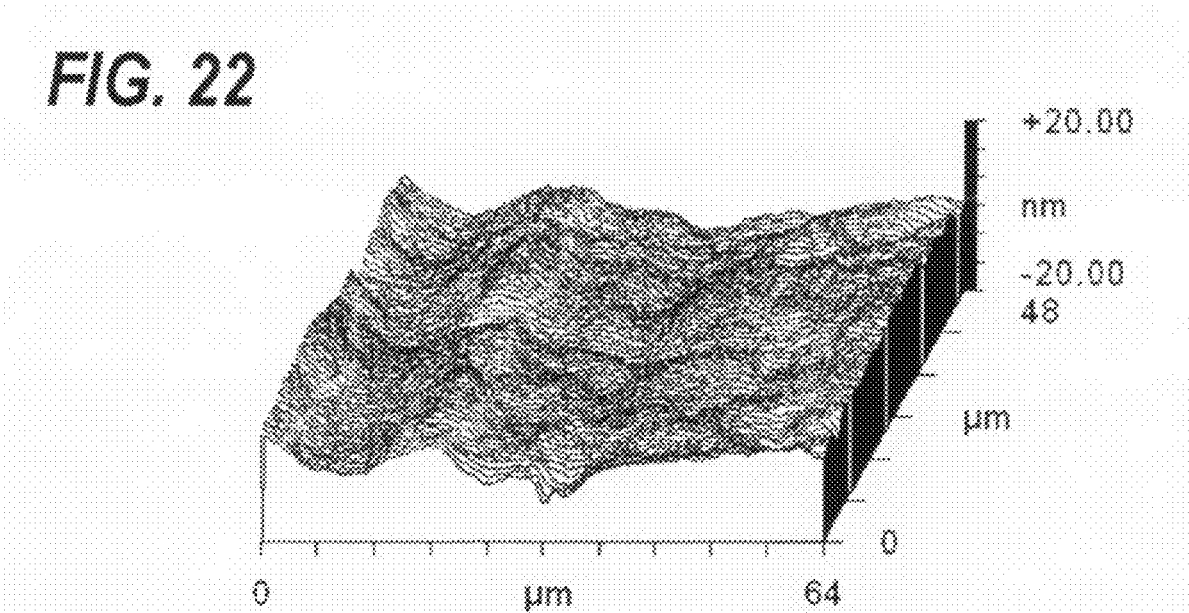
FIG. 22 is a perspective view of a surface of a processing sample after processing in Example 7.
Figure 23:
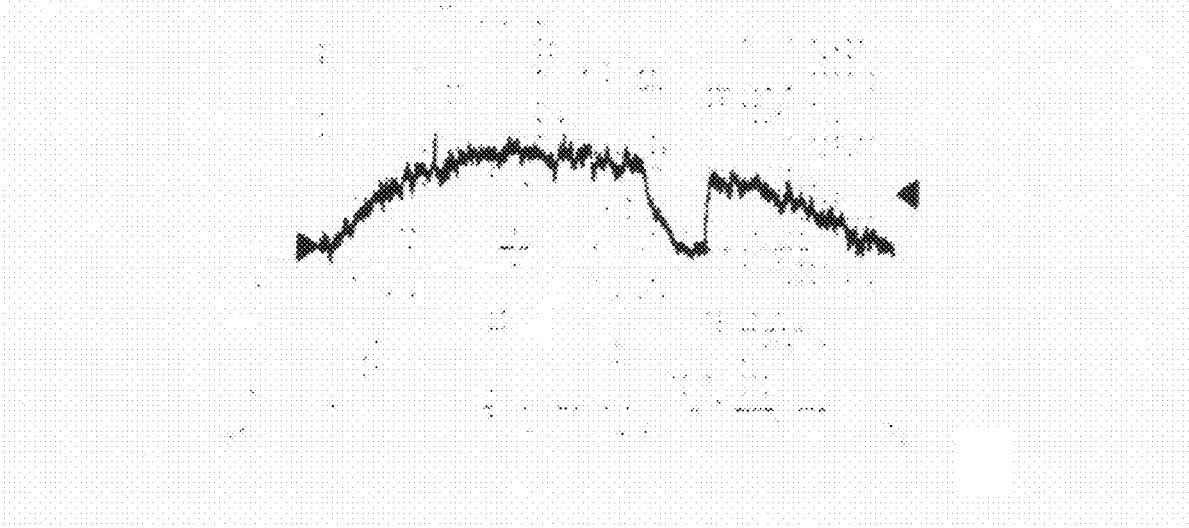
FIG. 23 is a diagram showing a cross-sectional profile of the processing sample after processing in Example 7.

Processing of the surface of the same SiC processing sample 10 was carried out in the same manner as in Example 2 except for applying a voltage of 3V (−3V) between the processing sample 10 and the coin-shaped catalyst 16 with the coin-shaped catalyst 16 as a cathode. The results of the processing are shown in FIGS. 22 and 23. FIG. 22 shows a perspective view of the surface of the processing sample after processing, and FIG. 23 shows a cross-sectional profile of the processing sample after processing. A groove having a depth of about 100 nm was processed in the surface of the processing sample.

As will be appreciated from comparison of the results of Examples 2 to 4 with the results of Examples 5 to 7, when carrying out processing of a SiC workpiece using a molybdenum catalyst and an aqueous HF solution as a processing liquid, the processing rate of the SiC workpiece can be made higher by applying a voltage between the catalyst and the workpiece with the catalyst as an anode, as compared to the case of not applying a voltage. In contrast, the processing rate of the SiC workpiece is lowered by applying a voltage between the catalyst and the workpiece with the catalyst as a cathode. In addition, the application of a high voltage can worsen the surface configuration of the processed workpiece.

In the above-described embodiments, hydrofluoric acid is used as a processing liquid and molybdenum is used as a catalyst, and a surface of a workpiece is processed while applying a voltage between the catalyst and the workpiece. In such a case of processing a surface of a workpiece while applying a voltage between a catalyst and the workpiece, it is also possible to use platinum, gold, a ceramic solid catalyst or a molybdenum alloy as the catalyst instead of molybdenum. It is possible also with such a catalyst as platinum, gold, etc. to make the surface (facing a workpiece) of the catalyst an activated region, as with the above-described embodiment illustrated in FIG. 7B, so as to promote the dissociation reaction of a halide and produce a large amount of halogen radicals, thereby increasing the processing rate.

A wide band gap material, such as GaN or SiC, is very stable chemically. It is therefore difficult to obtain a sufficiently high processing rate of the material even when it is reacted with halogen atoms as produced thorough dissociation and adsorption by the catalytic action of molybdenum. The processing rate of a workpiece of such a material can be increased by irradiating the surface (surface to be processed) of the workpiece with light during the reaction so as to activate the surface to be processed. The wavelength of the irradiating light is preferably not more than a wavelength which corresponds to the band gap of the workpiece, for example, not more than 383 nm when processing SiC, because the band gap of 4H—SiC is 3.26 eV, and not more than 365 nm when processing GaN, because the band gap of GaN is 3.42 eV.

Figure 24A:
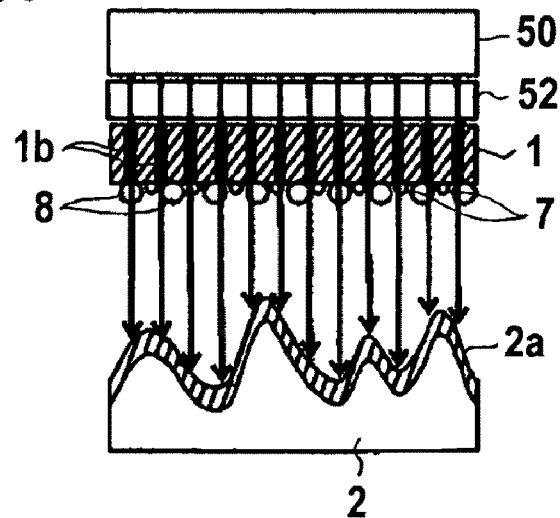
FIGS. 24A through 24C are conceptual diagrams illustrating another variation of the first catalyst-aided chemical processing method of the present invention, with FIG. 24A illustrating irradiation of a surface to be processed of a workpiece with light, FIG. 24B illustrating the progress of processing of the surface to be processed of the workpiece, which has been brought into contact with or close proximity to a catalyst, through dissolution of surface atoms of the workpiece in a processing liquid by a chemical reaction between the surface atoms and reaction species generated at the surface of the catalyst, and FIG. 24C illustrating the stoppage of the processing reaction upon separation of the catalyst from the surface to be processed of the workpiece.
Figure 24B:
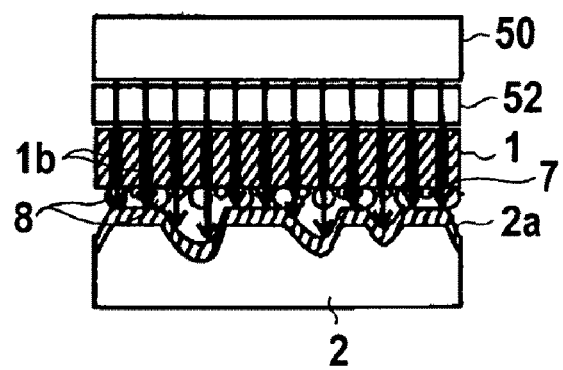
Figure 24C:
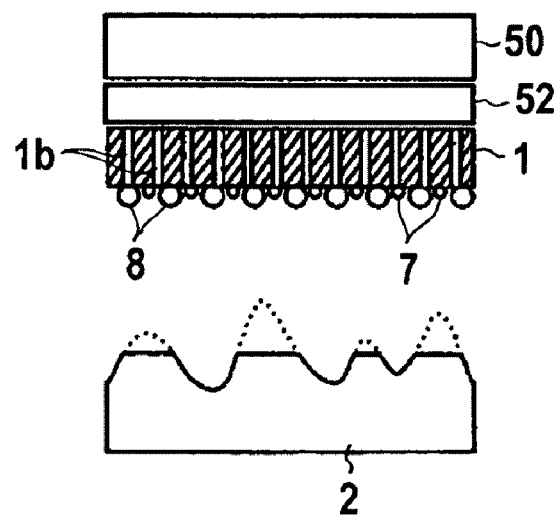

FIGS. 24A through 24C are conceptual diagrams illustrating a processing method which uses hydrofluoric acid (aqueous HF solution) as a processing liquid and molybdenum (Mo) as a catalyst 1, respectively, and irradiates a surface (surface to be processed) of a workpiece 2 with light during processing of the surface of the workpiece 2. As shown in FIGS. 24A through 24C, a light source 50 is provided above the catalyst 1, and an excitation light transmissive window 52 is provided between the catalyst 1 and the light source 50. Further, a large number of light passing holes 1b, which vertically penetrate the catalyst 1 and permit passage of light therethrough, are provided in the catalyst 1. The other features of this processing method are the same as the processing method illustrated in FIGS. 1A through 1C. By providing between the catalyst 1 and the light source 50 the excitation light transmissive window 52 that is transparent to light from the light source 1, the light source 50 can be prevented from being corroded by the processing liquid in which hydrogen fluoride (HF) is dissolved. A fluoride glass, such as $CaF_2$, is preferably used for the excitation light transmissive window 52.

Also in this method, when the catalyst 1 and the workpiece 2 are put in the processing liquid in which hydrogen fluoride (HF) is dissolved, the HF is dissociated at a surface of the catalyst 1 to generate H atoms 7 and halogen radicals (F radicals) 8, as shown in FIG. 24A. A surface (surface to be processed) of the workpiece 2 is irradiated with light, for example having a wavelength which is not more than a wavelength corresponding to the band gap of the workpiece 2, emitted from the light source 50, thereby activating the surface (surface to be processed) of the workpiece 2 and making the surface an excited portion 2a. When the catalyst 1 is then brought into contact with or close proximity to the surface to be processed of the workpiece 2, as shown in FIG. 24B, surface atoms of the surface to be processed in the contact portions are dissolved in the processing liquid by chemical reaction. The processing rate is increased by the excited portion 2a activated by light excitation. When the catalyst 1 is separated from the surface to be processed of the workpiece 2, as shown in FIG. 24C, the dissolution reaction ceases because the F radicals generated at the surface of the catalyst 1 do not act on the surface of the workpiece 2 any more. Further, when the light irradiation is stopped, the surface of the workpiece 2 in not an activated portion any more. Thus, the surface to be processed of the workpiece 2 is processed only when the catalyst 1 is in contact with or in close proximity to the surface to be processed.

In this embodiment, hydrofluoric acid is used as a processing liquid and molybdenum is used as a catalyst, and a surface (surface to be processed) of a workpiece is processed while irradiating the surface to be processed with light. In such a case of processing a surface (surface to be processed) of a workpiece while irradiating the surface to be processed with light, it is also possible to use platinum, gold, a ceramic solid catalyst or a molybdenum alloy as a catalyst instead of molybdenum. It is possible also with such a catalyst to make the surface to be processed of the workpiece an excited portion activated by light excitation, as illustrated in FIG. 24A, thereby increasing the processing rate.

As is known by the Arrhenius equation, the higher the reaction temperature of a chemical reaction is, the higher is the reaction rate. The present processing method is based on a chemical reaction. It is therefore possible to control the processing rate of a workpiece by controlling the reaction temperature of the chemical reaction. The reaction temperature can be controlled by controlling at least one of the temperature of the workpiece, the temperature of the processing liquid, and the temperature of the catalyst.

Figure 25:
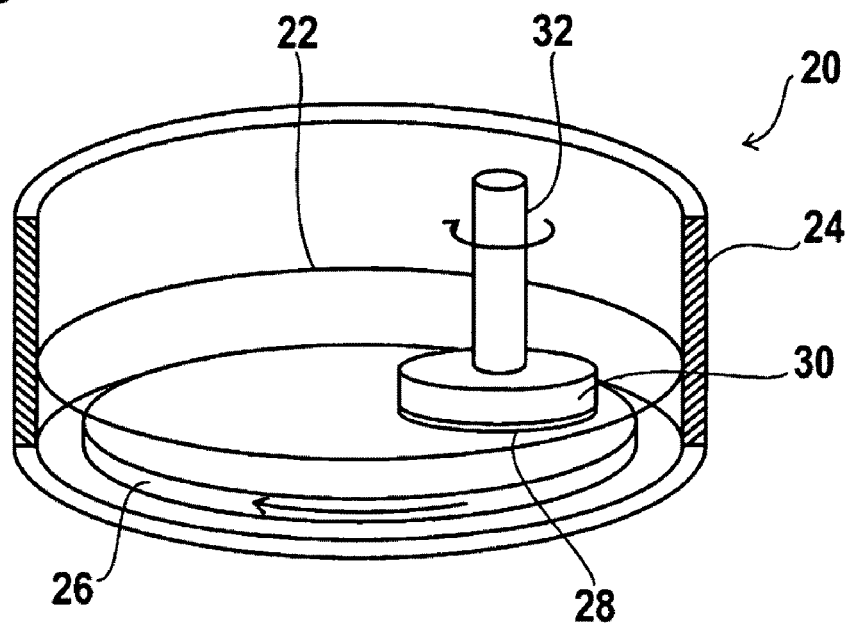
FIG. 25 is a schematic perspective view of a catalyst-aided chemical processing apparatus, adapted for use as a polishing apparatus, according to an embodiment of the present invention.

FIG. 25 shows a schematic perspective view of a catalyst-aided chemical processing apparatus, adapted for use as a polishing apparatus, according to an embodiment of the present invention. The polishing apparatus (catalyst-aided chemical processing apparatus) 20 includes a vessel 24 which is to be filled with a processing liquid 22, a catalyst platen 26 formed of molybdenum or a molybdenum alloy, rotatably disposed in the vessel 24, and a holder 30 for detachably holding a workpiece 28 with its front surface (surface to be processed) facing downwardly. The holder 30 is formed of a material, such as SiC, having excellent processability, chemical resistance and temperature resistance, though it may also be formed of hard vinyl chloride or PEEK, and is coupled to the front end of a vertically-movable rotating shaft 32 provided parallel and eccentric to the rotation axis of the catalyst platen 26. The holder 30 is supported pivotably with respect to the rotating shaft 32 (via a ball bearing) so that the workpiece-holding face of the holder 30 can follow the surface of the catalyst platen 26 and the entire surface of the workpiece 28 can make contact with the catalyst platen 26.

In operation, the vessel 24 is filled with the processing liquid 22, and the catalyst platen 26 and the workpiece 28 held by the holder 30 are rotated while pressing the workpiece 28 against the catalyst platen 26 at a predetermined pressure to process and flatten the surface (lower surface) of the workpiece 28. Grooves arranged in a net-like pattern, in a pattern of concentric circles or in a spiral pattern may be provided in the surface of the catalyst platen 26 so that, as the catalyst platen 26 rotates, a fresh processing liquid can be supplied to the processing area.

Instead of the dip processing manner of immersing the catalyst platen 26 and the workpiece 28 in the processing liquid 22 that fills the vessel 24, it is also possible to supply the processing liquid 22 from a nozzle (not shown), disposed above the catalyst platen 26, to between the catalyst platen 26 and the workpiece 28. In the case where the processing liquid is reused by circulation, it is preferred to purify the processing liquid to remove sludge before reusing the processing liquid. It is also possible to use an apparatus having the vertically reverse structure to that shown in FIG. 25. Thus, a workpiece is disposed with its surface to be processed facing upwardly, and a catalyst platen, facing the surface to be processed and disposed above the workpiece, is brought into light contact with or close proximity to the workpiece.

The surface of the workpiece 28, such as a SiC wafer, is processed by using molybdenum (Mo) or a molybdenum alloy as a material for the catalyst platen 26 and using hydrofluoric acid or a solution, in which halogen-containing molecules are dissolved, as the processing liquid 22.

Example 8

Using molybdenum (Mo) having a purity of 99.95% as a material for the catalyst platen 26 and hydrofluoric acid (50% HF) as the processing liquid 22 in the polishing apparatus shown in FIG. 25, a 2-inch SiC wafer as a processing sample and the catalyst platen 26, both immersed in the hydrofluoric acid, were rotated both at 20 rpm for 18 hours while keeping the catalyst platen 26 in contact with the wafer at a load of 5 kg, thereby processing and flattening the surface of the processing sample. The weight of the processing sample (SiC wafer) was measured before and after the processing. As a result, the weight of the processing sample was 2.4368 g before the processing and 2.4357 g after the processing. The processing amount was thus found to be 0.0011 g that corresponds to 1.8 μm in terms of a thickness of the SiC wafer.

Comparative Example 2

Processing and flattening of the same processing sample, the SiC wafer, was carried out in the same manner as in Example 8 except for using platinum (Pt) having a purity of 99.98% as a material for the catalyst platen 26. The weight of the processing sample (SiC wafer) was measured before and after the processing. As a result, the weight of the processing sample was 2.4310 g before the processing and 2.4308 g after the processing. The processing amount was thus found to be 0.0002 g that corresponds to 0.3 μm in terms of a thickness of the SiC wafer.

As can be seen from the comparative data obtained, the use of molybdenum for the catalyst platen 26 in the processing (polishing) of the SiC wafer, as compared to the use of platinum, can increase the processing rate by about 6 times. This is considered to be due to the fact that the reaction of dissociation of HF into H atom and F radical is more likely to occur on the surface of the molybdenum catalyst platen 26 than on the platinum catalyst platen 26.

Figure 26:
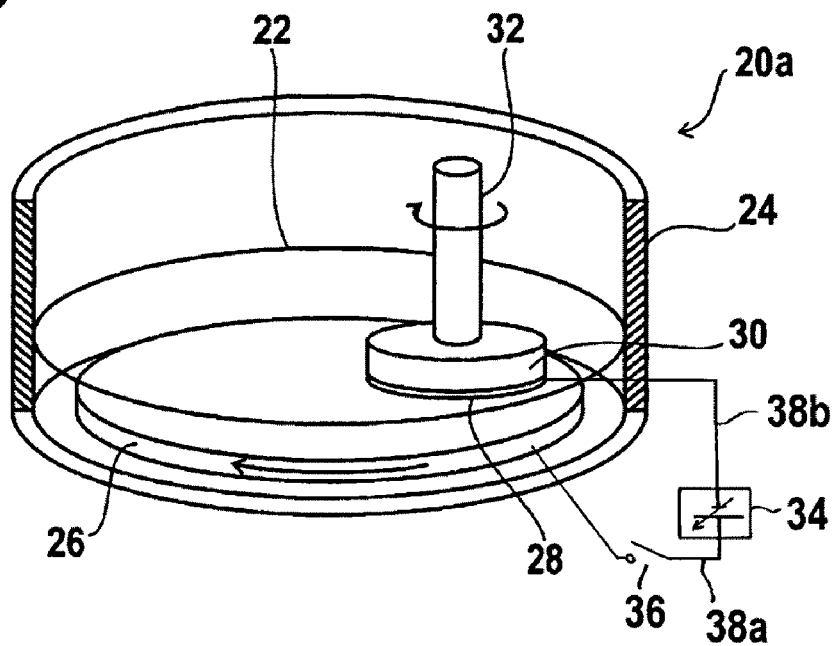
FIG. 26 is a schematic perspective view of a catalyst-aided chemical processing apparatus, adapted for use as a polishing apparatus, according to another embodiment of the present invention.

FIG. 26 shows a schematic perspective view of a catalyst-aided chemical processing apparatus, adapted for use as a polishing apparatus, according to another embodiment of the present invention. The polishing apparatus (catalyst-aided chemical processing apparatus) 20a shown in FIG. 26 differs from the polishing apparatus (catalyst-aided chemical processing apparatus) 20 shown in FIG. 25 in that the polishing apparatus 20a is provided with a power source 34 whose anode and cathode are reversible, and a conducting wire 38a extending from one pole of the power source 34 and having a switch 36 interposed therein is connected to the catalyst platen 26, and a conducting wire 38b extending from the other pole of the power source 34 is connected to a workpiece 28. In this embodiment, in addition to molybdenum or a molybdenum alloy, it is also possible to use platinum, gold or a ceramic solid catalyst for the catalyst platen 26.

As schematically shown in FIGS. 24A through 24C, it is also possible to provide a large number of light passing holes in the catalyst platen 26 and dispose a light source below the catalyst platen 26, and to irradiate the surface (surface to be processed) of the workpiece 28 with light whose wavelength is preferably not more than a wavelength which corresponds to the band gap of the workpiece 28. An excitation light transmissive window, which is transparent to light from the light source, may be interposed between the light source and a processing liquid in which hydrogen fluoride (HF), for example, is dissolved, so as to prevent the light source from being corroded by the processing liquid. A fluoride glass, such as $CaF_2$, is preferably used for the excitation light transmissive window.

In operation, the vessel 24 is filled with the processing liquid 22, and the catalyst platen 26 and the workpiece 28 held by the holder 30 are rotated while pressing the workpiece 28 against the catalyst platen 26 at a predetermined pressure to process and flatten the surface (lower surface) of the workpiece 28. During the processing, according to necessity, a predetermined voltage is applied between the catalyst platen 26 and the workpiece 28 with the catalyst platen 26, for example, as an anode. In the case where the light source is provided, according to necessity, the surface (surface to be processed) of the workpiece 28 is irradiated with light having a predetermined wavelength.

Figure 27:
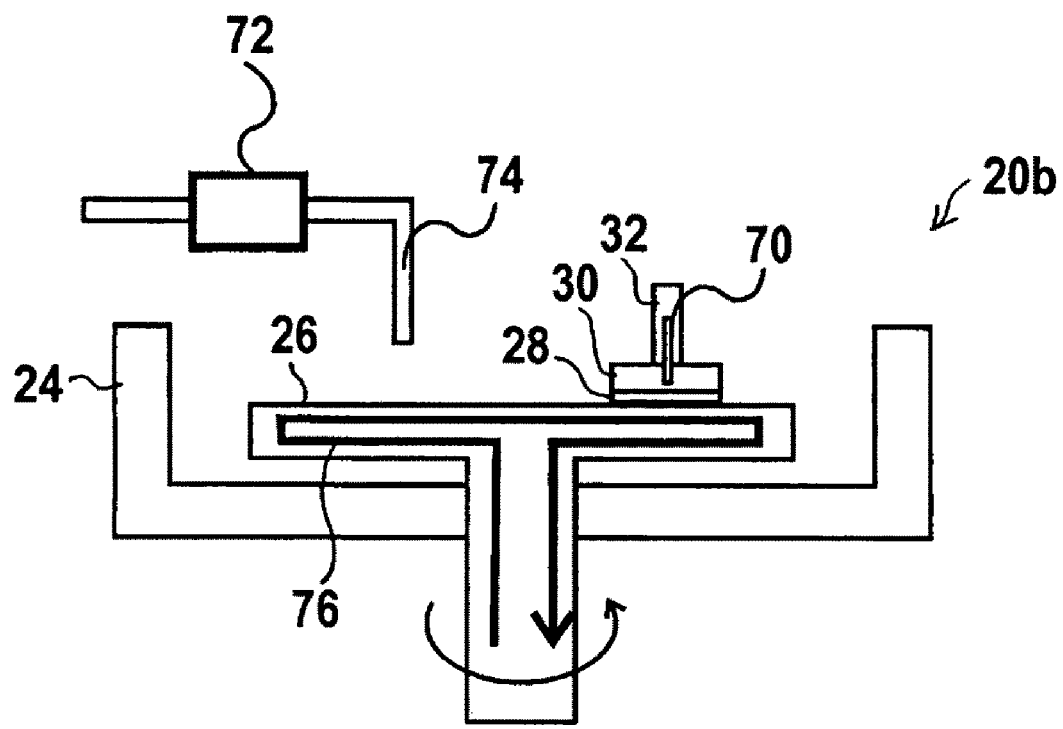
FIG. 27 is a schematic perspective view of a catalyst-aided chemical processing apparatus, adapted for use as a polishing apparatus, according to yet another embodiment of the present invention.

FIG. 27 shows a schematic perspective view of a catalyst-aided chemical processing apparatus, adapted for use as a polishing apparatus, according to yet another embodiment of the present invention. The polishing apparatus (catalyst-aided chemical processing apparatus) 20b shown in FIG. 27 differs from the polishing apparatus (catalyst-aided chemical processing apparatus) 20 shown in FIG. 25 in the following respects: Embedded in the holder 30 and extending in the rotating shaft 32, there is provided a heater 70 as a temperature control mechanism for controlling the temperature of a workpiece 28 held by the holder 30. Above the vessel 24 is disposed a processing liquid supply nozzle 74 as a temperature control mechanism for supplying a processing liquid, whose temperature is controlled at a predetermined temperature by a heat exchanger 72, into the vessel 24. Further, a fluid passage 76 as a temperature control mechanism for controlling the temperature of the catalyst platen 26 is provided in the interior of the catalyst platen 26.

Though, in this embodiment, are provided the heater 70 as a temperature control mechanism for controlling the temperature of the workpiece 28, the processing liquid supply nozzle 74 as a temperature control mechanism for controlling the temperature of the processing liquid, and the fluid passage 76 as a temperature control mechanism for controlling the temperature of the catalyst platen 26, it is also possible to provide only one or two of them. As with the embodiment shown in FIG. 26, in addition to molybdenum or a molybdenum alloy, it is also possible to use platinum, gold or a ceramic solid catalyst for the catalyst platen 26 in this embodiment.

As is known by the Arrhenius equation, the higher the reaction temperature of a chemical reaction is, the higher is the reaction rate. According to this embodiment, the reaction temperature can be controlled by controlling at least one of the temperature of the workpiece 28, the temperature of the processing liquid and the temperature of the catalyst platen 26, whereby the processing rate can be changed.

The first catalyst-aided chemical processing method of the present invention can be applied not only to uniaxial processing or two-dimensional processing but to various types of removal processing, including processing of a three-dimensional workpiece into a desired shape as by bringing a spherical or cylindrical catalyst into contact with the workpiece. The above-described voltage application, light irradiation and temperature control may be employed either singly or in a desired combination to promote processing.

In the first catalyst-aided chemical processing process of the present invention, a catalyst composed of molybdenum (Mo) or a molybdenum alloy serves as a processing reference plane, halogen-containing molecules in a processing liquid are dissociated at the surface of the catalyst to generate halogen radicals, and the halogen radicals and OH radicals, generated by the decomposition of water molecules caused by the halogen radicals, act on the surface to be processed of a workpiece, whereby processing of the workpiece progresses.

According to the first catalyst-aided chemical processing method of the present invention, molybdenum or a molybdenum compound, which performs a catalytic function, is brought into contact with or close proximity to a surface to be processed in a processing liquid, without using abrasive grains or a polishing material, and the molybdenum or molybdenum compound and the surface to be processed are moved relative to each other, whereby processing progresses while a new surface to be processed emerges continually. The radicals generated at the surface of the catalyst rapidly become inactive as they leave the catalyst surface. Thus, the radicals exist only on or in the vicinity of the catalyst surface serving as a reference plane. This makes it possible to process a workpiece in a spatially-controlled condition.

Because the first catalyst-aided chemical processing method of the present invention is a chemical processing method that utilizes a reference plane, highly effective processing and flattening of a surface to be processed having a space wavelength range of not less than several tens of μm, which has been difficult with EEM or plasma CVM, becomes possible. In addition, the present processing method makes it possible to process with high precision not only Si but also SiC, GaN, and even sapphire, ruby and diamond which have heretofore been difficult to process. The present processing method can therefore be expected to be usable in semiconductor device manufacturing processes.

The first catalyst-aided chemical processing method of the present invention thus uses a platinum, gold or a ceramic solid catalyst, molybdenum or a molybdenum compound for a processing reference plane, and processes a workpiece by generating halogen radicals through dissociation of halogen-containing molecules, dissolved in a processing liquid, at the surface of the catalyst, and dissolving in the processing liquid a halogen compound formed by a chemical reaction between a halogen radical and a surface atom of the workpiece in contact with or close proximity to the catalyst. A hydrohalic acid, in which a workpiece normally is insoluble or hardly soluble, may therefore be used as the processing liquid. The halogen radicals, generated at the surface of the catalyst, rapidly become inactive as they leave the surface of the catalyst. Thus, the halogen radicals exist only on or in the vicinity of the catalyst surface which serves as a reference plane. The present processing method can therefore be a chemical processing method in which processing progresses only just under the reference plane of the catalyst.

When hydrofluoric acid is used as a processing liquid and platinum is used as a catalyst in the first catalyst-aided chemical processing method of the present invention, because of poor wetting of the platinum surface by hydrofluoric acid, it may be difficult to effectively supply the processing liquid (hydrofluoric acid) to the catalyst surface serving as a processing reference plane. In such a case, a wetting improver can be added to the processing liquid, hydrofluoric acid, so as to effectively supply the processing liquid to the catalyst surface. Nitric acid or ethanol may be preferably used as a wetting improver.

A second catalyst-aided chemical processing method of the present invention will now be described.

Many metal elements form oxides when combined with oxygen. These oxides have either the nature of a Brensted acid, the nature of a Brensted base or both the natures of Brensted acid and base, and such oxides are called an acidic oxide, a basic oxide and an amphoteric oxide, respectively. For example, copper, nickel, etc. form a basic oxide, tungsten, etc. form an acidic oxide, and aluminum, titanium, iron, gallium, etc. form an amphoteric oxide. An acidic oxide is an oxide which reacts with a base, a basic oxide is an oxide which reacts with an acid, and an amphoteric oxide is an oxide which reacts both with an acid and with a base. An oxide, when reacted with an acid or a base, becomes an ion and dissolves in a liquid.

For example, copper combines with oxygen to form copper oxide (CuO) which is a basic oxide, and the copper oxide reacts with an acid ($H^+$) and becomes copper ion in accordance with the following chemical formula (3) and dissolves in a liquid:

$$CuO(s) + 2H^+(aq) \rightarrow Cu^{2+}(aq) + H_2O \qquad (3)$$

Tungsten combines with oxygen to form tungsten oxide ($WO_3$) which is an acidic oxide, and the tungsten oxide reacts with a base ($OH^-$) and becomes tungstate ion in accordance with the following chemical formula (4) and dissolves in a liquid:

$$WO_3(s) + 2OH^-(aq) \rightarrow WO_4^{2-}(aq) + H_2O \qquad (4)$$

Aluminum combines with oxygen to form aluminum oxide ($Al_2O_3$) which is an amphoteric oxide, and the aluminum oxide either reacts with an acid ($H^+$) and becomes aluminum ion in accordance with the following chemical formula (5) and dissolves in a liquid, or reacts with a base ($OH^-$) and becomes aluminate ion in accordance with the following chemical formula (6) and dissolves in a liquid:

$$Al_2O_3(s) + 6H^+(aq) \rightarrow 2Al^{3+}(aq) + 3H_2O \qquad (5)$$

$$Al_2O_3(s) + 3H_2O + 2OH^-(aq) \rightarrow 2[Al(OH)_4]^-(aq) \qquad (6)$$

An acidic or basic solid catalyst, for example, a non-woven fabric having an ion exchange function, shows an acidic or basic nature at a surface of the catalyst. When a basic oxide of, e.g., copper or nickel, or an amphoteric oxide of, e.g., aluminum or gallium is brought into contact with or proximity to a solid catalyst which shows an acidic nature (acidic solid catalyst), such an oxide reacts with an acid ($H^+$ ion) and becomes an ion, and dissolves in a liquid. Accordingly, a surface of a copper workpiece, for example, can be processed by putting the workpiece in an oxidizing processing liquid, such as ozone water, to oxidize a surface of the workpiece, and bringing the oxide into contact with or close proximity to an acidic solid catalyst to convert the surface oxide into copper ion and dissolve it in the processing liquid.

Similarly, when an acidic oxide of, e.g., tungsten, or an amphoteric oxide of, e.g., aluminum or gallium is brought into contact with or proximity to a solid catalyst which shows a basic nature (basic solid catalyst), such an oxide reacts with a base ($OH^-$ ion) and becomes an ion, and dissolves in a liquid. Accordingly, a surface of a tungsten workpiece, for example, can be processed by putting the workpiece in an oxidizing processing liquid, such as ozone water, to oxidize the surface of the workpiece, and bringing the oxide into contact with or close proximity to a basic solid catalyst to convert the surface oxide into tungstate ion and dissolve it in the processing liquid.

Figure 28A:
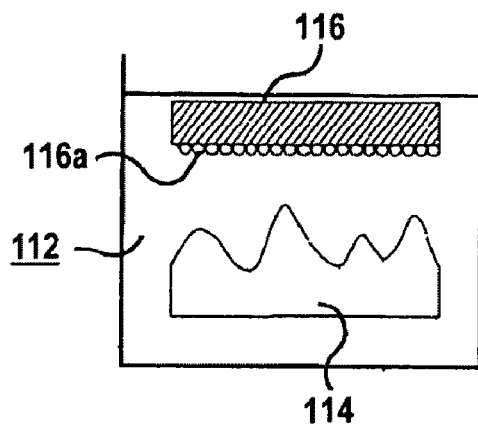
FIGS. 28A through 28D are conceptual diagrams illustrating a second catalyst-aided chemical processing method of the present invention, with FIG. 28A showing the state of a workpiece before processing, FIG. 28B showing the state of the workpiece when its surface to be processed is oxidized, FIG. 28C showing the state of the workpiece when an acidic solid catalyst has been brought into contact with the workpiece, and FIG. 28D showing the state of the workpiece after processing.
Figure 28B:
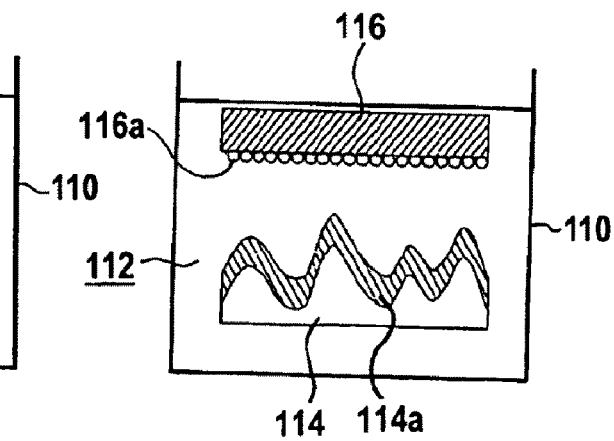

The second catalyst-aided chemical processing method of the present invention, which involves the use of an oxidizing processing liquid to process, e.g., a copper surface, will now be outlined with reference to FIGS. 28A through 28D. First, as shown in FIG. 28A, a vessel 110 is filled with an oxidizing processing liquid 112, for example, ozone water having a concentration of 4 ppm, and a workpiece 114, at least a surface of which is composed of copper, is immersed in the processing liquid 112. Further, a solid catalyst having an acidic nature (acidic solid catalyst) 116 is immersed in the oxidizing processing liquid 112 and disposed at the top of the vessel 110. A large amount of hydrogen ions ($H^+$) 116a are generated at the surface of the acidic solid catalyst 116, while the surface of the workpiece (copper) 114 is oxidized by the oxidizing processing liquid 112 to form copper oxide (CuO) 114a, which is a basic oxide, in the surface of the workpiece 114, as shown in FIG. 28B.

Figure 28C:
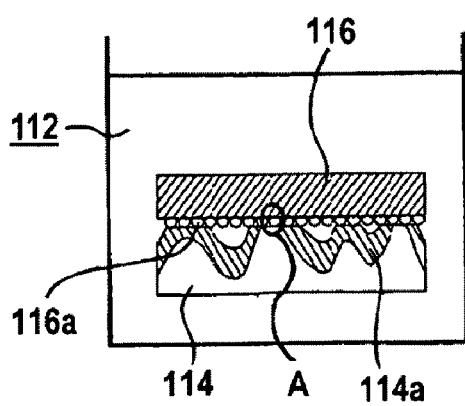
Figure 28D:
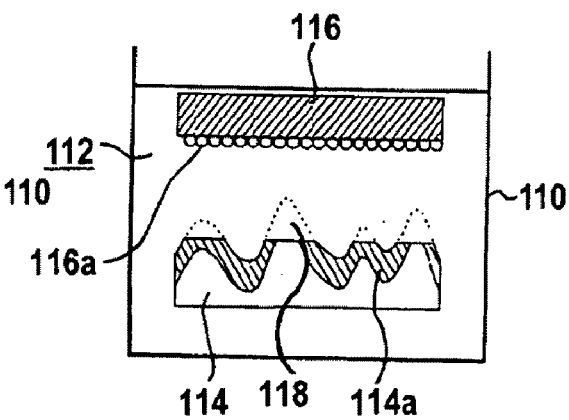

The surface of the acidic solid catalyst 116 is then brought into contact with the surface of the copper oxide 114a, e.g., at a pressure of about 0.01 to 5 kgf/cm$^2$, as shown in FIG. 28C, whereupon the copper oxide (CuO) 114a makes etching reaction with the hydrogen ions ($H^+$) 116a, generated at the surface the acidic solid catalyst 116, in the contact portions A with the acidic solid catalyst 116 and becomes copper ions ($Cu^{2+}$), as shown by the above-described chemical formula (3), and dissolves in the oxidizing processing liquid 112. The portions 118 of the copper oxide 114a, which have made contact with the surface of the acidic solid catalyst 116, have thus been removed, as shown in FIG. 28D. The surface of the copper workpiece 114 is processed in this manner.

According to this embodiment, the etching reaction occurs only in the contact portions A of the workpiece 114 with the acidic solid catalyst 116, whereby only the contact portions A are processed. Processing and flattening of the surface of the workpiece 114 with the surface of the acidic solid catalyst 116 as a reference plane thus becomes possible. Further, there is no acidic or basic solution remaining on the surface of the workpiece after processing. This can eliminate the need for replacement, e.g., with ultrapure water.

According to the present catalyst-aided chemical processing method, hydrogen ions 116a as reaction species are produced only on the surface of the acidic solid catalyst 116 and the physical properties of the surface of the acidic solid catalyst 116 do not change over a long time period. Therefore, unlike chemical etching, a surface to be processed can be processed without being influenced by the surface indices of the processing surface and a crystal fault in the surface. Since the present chemical processing method involves transfer of the reference plane, the surface of the acidic solid catalyst 116, atomic-level flattening of a surface to be processed as in EEM can be expected. Furthermore, the reference plane will not change with the progress of processing and with transfer of the reference plane. The present catalyst-aided chemical processing method can therefore be expected to be an efficient ultraprecision processing method.

In addition to ozone water, a hydrogen peroxide solution may be used as the oxidizing processing liquid 112. When ozone water is used as the oxidizing processing liquid 112, the use of a higher ozone concentration provides a higher oxidation rate for the workpiece 114. The ozone concentration of ozone water is preferably determined such that the oxidation rate of ozone water is lower than the etching rate of the acidic solid catalyst 116. This makes it possible to remove the copper oxide 114a as soon as it is formed in the surface of the workpiece 114 when moving the workpiece 114 and the acidic solid catalyst 116 relative to each other while keeping them in contact with each other in the oxidizing processing liquid 112, thereby preventing pitting corrosion in the surface to be processed of the workpiece 114 and also preventing the surface to be processed from becoming an oxide film.

The acidic solid catalyst 116 is composed of, for example, an acidic ion exchanger, glass, or a metal oxide having an acidic nature, for example, a ceramic such as alumina, zirconia or silicon oxide. When an acidic ion exchanger is used as the acidic solid catalyst 116, the etching rate for the workpiece 114 can be increased by increasing the acidic ion exchange capacity of the acidic solid catalyst 116. The ozone concentration of ozone water is preferably balanced with the ion exchange capacity of the acidic solid catalyst 116 so that an oxide film will not grow on the workpiece 114.

The embodiment shown in FIGS. 28A through 28D can process, in addition to copper, nickel whose oxide is basic and aluminum, titanium, iron, gallium, etc. whose oxides are amphoteric. On the other hand, tungsten, etc. whose oxides are basic as well as aluminum, titanium, iron, gallium, etc. whose oxides are amphoteric, can be processed by using a solid catalyst having a basic nature (basic solid catalyst) instead of the acidic solid catalyst 116.

Though, in this embodiment, the acidic solid catalyst 116 is brought into contact with the workpiece 114, it is also possible to bring the acidic solid catalyst 116 into close proximity to the workpiece 114.

It is also possible to disperse an acidic solid catalyst in a powdery form in an oxidizing processing liquid and supply the powder to a surface to be processed of a workpiece by a flow of the oxidizing processing liquid.

Example 9

Figure 29:
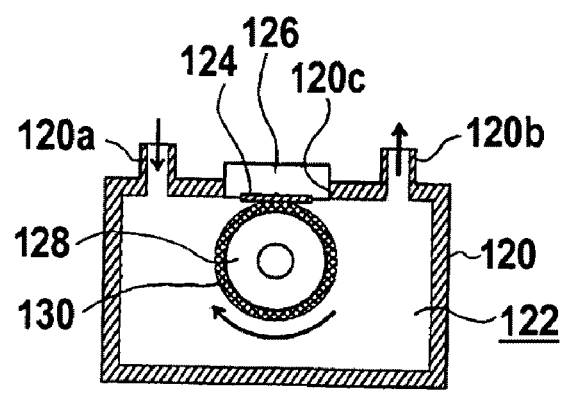
FIG. 29 is a conceptual perspective view of a processing apparatus for basic experiment, adapted to carry out the method shown in FIGS. 28A through 28D.

A copper-processing apparatus was manufactured to confirm the processing principle of the second catalyst-aided chemical processing method of the present invention. FIG. 29 shows a conceptual diagram of the processing apparatus for basic experiment. The processing apparatus includes a vessel 120 which has at its top a liquid inlet 120a, a liquid outlet 120b and an opening 120c, and which is to be filled with an oxidizing processing liquid 122, e.g., ozone water having a concentration of 4 ppm, and a holder 126, disposed in the opening 120c of the vessel 120, for holding a copper-plated sample 124 in the lower surface. A rotator 128 that rotates in a vertical plane is disposed in the vessel 120, and a solid catalyst having an acidic nature (acidic solid catalyst) 130 is fixed on the peripheral surface of the rotator 128. The acidic solid catalyst 130 is composed of, for example, a non-woven fabric of polyethylene fibers, having an acidic ion exchange function imparted by graft polymerization.

Using the processing apparatus, processing of the surface copper of the copper-plated sample 124 was carried out for 10 minutes by bringing the lower surface of the copper-plated sample 124, held by the holder 126, into contact with the acidic solid catalyst 130 in the presence of the oxidizing processing liquid 122 while rotating the rotator 128 at 60 rpm. FIG. 30 shows a perspective view of the copper-plated sample 124 after the processing. As shown in FIG. 30, there was a concave processed recess formed in the surface of the copper-plated sample 124, indicating processability of copper. No etch pit was observed in the processed surface of the sample 124. This is considered to be due to the fact that only the portion of the sample 124 in contact with the acidic solid catalyst 130 was selectively etched.

Comparative Examples 3 to 5

Processing of the surface copper of the same copper-plated sample 124 was carried out in the same manner as in Example 9 except for using a non-woven fabric having no ion exchange function instead of the acidic solid catalyst 130 (Comp. Example 3), using a solid catalyst having a basic nature (basic solid catalyst) instead of the acidic solid catalyst 130 (Comp. Example 4), and using pure water instead of the oxidizing processing liquid 122 (Comp. Example 5)

FIGS. 31A through 31C show perspective views of the copper-plated samples after processing, with FIG. 31A corresponding to Comp. Example 3, FIG. 31B corresponding to Comp. Example 4, and FIG. 31C corresponding to Comp. Example 5. As can be seen from FIGS. 31A through 31C, the processed surfaces of the copper-plated samples were flat with no formation of processed recess. This indicates that copper cannot be processed by the methods of Comp. Examples 3 to 5.

Figure 32A:
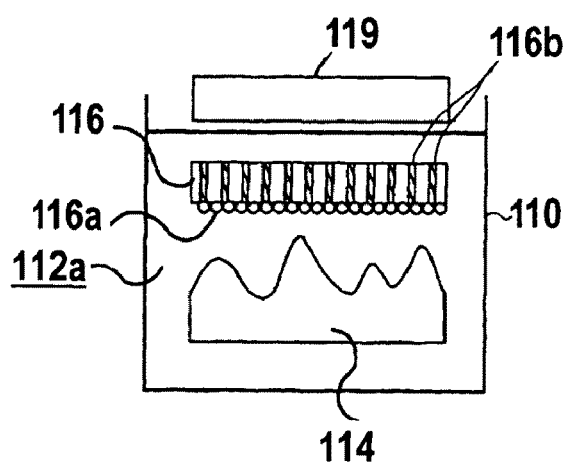
FIGS. 32A through 32D are conceptual diagrams illustrating a variation of the second catalyst-aided chemical processing method of the present invention, with FIG. 32A showing the state of a workpiece before processing, FIG. 32B showing the state of the workpiece when its surface to be processed is oxidized, FIG. 32C showing the state of the workpiece when an acidic solid catalyst has been brought into contact with the workpiece, and FIG. 32D showing the state of the workpiece after processing.

A processing method, which involves irradiation of a surface to be processed of a workpiece with light, preferably ultraviolet light to process a copper surface, will now be described with reference to FIGS. 32A through 32D. First, as shown in FIG. 32A, a vessel 110 is filled with a processing liquid 112a. Though the processing liquid 112a preferably is an oxidizing processing liquid, for example, ozone water having a concentration of 4 ppm, ultrapure water or oxygen water (ultrapure water containing a high concentration of dissolved oxygen) may also be used. A workpiece 114, at least a surface of which is composed of copper, is immersed in the processing liquid 112a. A solid catalyst having an acidic nature (acidic solid catalyst) 116, having therein a large number of light passing holes 116b that vertically penetrate the catalyst 116 and permit passage of light therethrough, is immersed in the processing liquid 112a and disposed at an upper position in the vessel 110. Further, a light source 119 is disposed at a position above the acidic solid catalyst 116 at which the light source is not in contact with the processing liquid 112a.

Figure 32B:
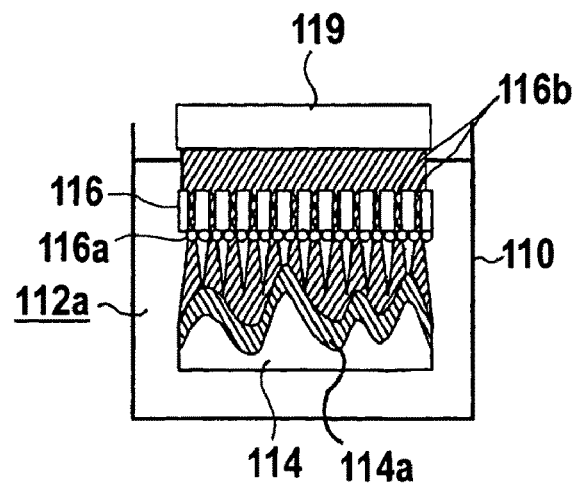

Light, preferably ultraviolet light, emitted from the light source 119, is passed through the light passing holes 116b in the acidic solid catalyst 116 and applied to the surface (surface to be processed) of the workpiece (copper) 114, as shown in FIG. 32B. The wavelength of the irradiating light is preferably not more than a wavelength which corresponds to the band gap of the workpiece, for example, not more than 383 nm when processing SiC, because the band gap of 4H—SiC is 3.26 eV, and not more than 365 nm when processing GaN, because the band gap of GaN is 3.42 eV.

By thus irradiating the surface (surface to be processed) of the workpiece 114 with light, preferably ultraviolet light, the surface to be processed can be oxidized to form copper oxide (CuO) 114a, which is a basic oxide, in the surface of the workpiece 114, as shown in FIG. 32B. The formation of the basic copper oxide (CuO) 114a can be promoted by using as the processing liquid 112a an oxidizing processing liquid, such as ozone water having a concentration of, e.g., 4 ppm.

Figure 32C:
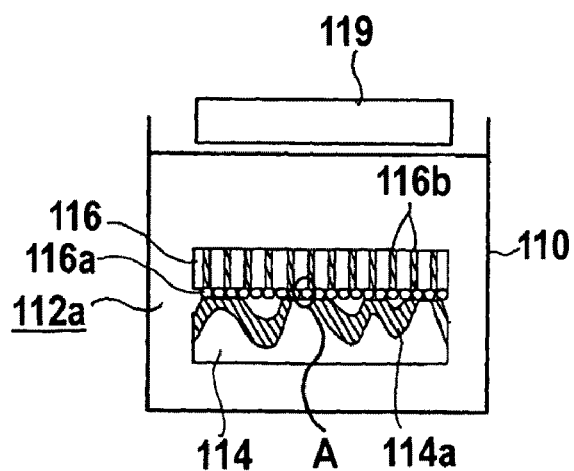
Figure 32D:
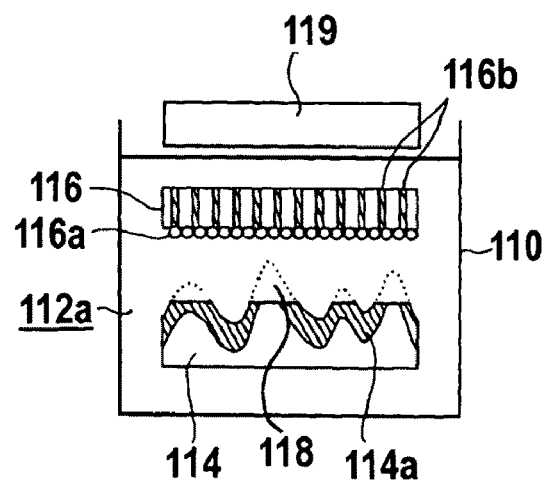

After stopping the irradiation with light of the surface (surface to be processed) of the workpiece 114, the surface of the acidic solid catalyst 116 is brought into contact with the surface of the copper oxide 114a, e.g., at a pressure of about 0.01 to 5 kgf/cm$^2$, as shown in FIG. 32C, whereupon the copper oxide (CuO) 114a makes etching reaction with hydrogen ions (H$^+$) 116a, generated at the surface the acidic solid catalyst 116, in the contact portions A with the acidic solid catalyst 116 and becomes copper ions (Cu$^{2+}$), as shown by the above-described chemical formula (3), and dissolves in the processing liquid 112a. The portions 118 of the copper oxide 114a, which have made contact with the surface of the acidic solid catalyst 116, have thus been removed, as shown in FIG. 32D. The surface of the copper workpiece 114 is processed in this manner.

Also in this embodiment, the etching reaction occurs only in the contact portions A of the workpiece 114 with the acidic solid catalyst 116 whereby only the contact portions A are processed. Processing and flattening of the surface of the workpiece 114 with the surface of the acidic solid catalyst 116 as a reference plane thus becomes possible. Further, hydrogen ions 116a as reaction species are produced only on the surface of the acidic solid catalyst 116 and the physical properties of the surface of the acidic solid catalyst 116 do not change over a long time period.

It is possible also with this embodiment to process, in addition to copper, nickel whose oxide is basic and aluminum, titanium, iron, gallium, etc. whose oxides are amphoteric. On the other hand, tungsten, etc. whose oxides are basic as well as aluminum, titanium, iron, gallium, etc. whose oxides are amphoteric, can be processed by using a solid catalyst having a basic nature (basic solid catalyst) instead of the acidic solid catalyst 116.

Though, in this embodiment, the acidic solid catalyst 116 is brought into contact with the workpiece 114, it is also possible to bring the acidic solid catalyst 116 into close proximity to the workpiece 114. It is also possible to disperse an acidic solid catalyst in a powdery form in a processing liquid and supply the powder to a surface to be processed of a workpiece by a flow of the processing liquid.

It is also possible to apply a voltage between a solid catalyst and a surface to be processed of a workpiece in order to promote oxidation of the surface to be processed. FIGS. 33A through 33D illustrate an embodiment in which the technique of voltage application is applied to the embodiment shown in FIGS. 28A through 28D. As shown in FIG. 33A through 33D, this embodiment uses a power source 160 whose anode and cathode are reversible. A conducting wire 164a extending from one pole of the power source 160 and having a switch 162 interposed therein is connected to the solid catalyst 116, and a conducting wire 164b extending from the other pole of the power source 160 is connected to the workpiece 114. The other features of this embodiment are the same as the embodiment illustrated in FIGS. 28A through 28D.

Figures 33A, 33B:
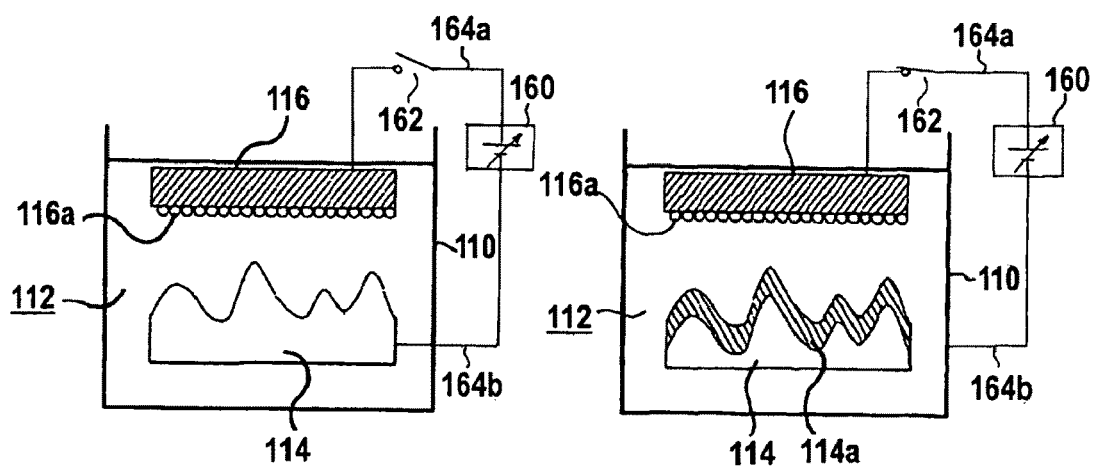
FIGS. 33A through 33D are conceptual diagrams illustrating another variation of the second catalyst-aided chemical processing method of the present invention, with FIG. 33A showing the state of a workpiece before processing, FIG. 33B showing the state of the workpiece when its surface to be processed is oxidized, FIG. 33C showing the state of the workpiece when an acidic solid catalyst has been brought into contact with the workpiece, and FIG. 33D showing the state of the workpiece after processing.

Also in this embodiment, when the workpiece 114 and the solid catalyst (acidic solid catalyst) 116 are immersed in the oxidizing processing liquid 112, a large amount of hydrogen ions (H$^+$) 116a are generated at the surface of the acidic solid catalyst 116, while the surface of the workpiece (copper) 114 is oxidized by the oxidizing processing liquid 112 to form copper oxide (CuO) 114a, which is a basic oxide, in the surface of the workpiece 114, as shown in FIG. 33B. When the switch 162 is then turned ON to apply such a voltage between the solid catalyst 116 and the workpiece 114 as to make the solid catalyst 116 an anode, as shown in FIG. 33B, the generation of copper oxide (CuO) 114a is promoted.

Figures 33C, 33D:
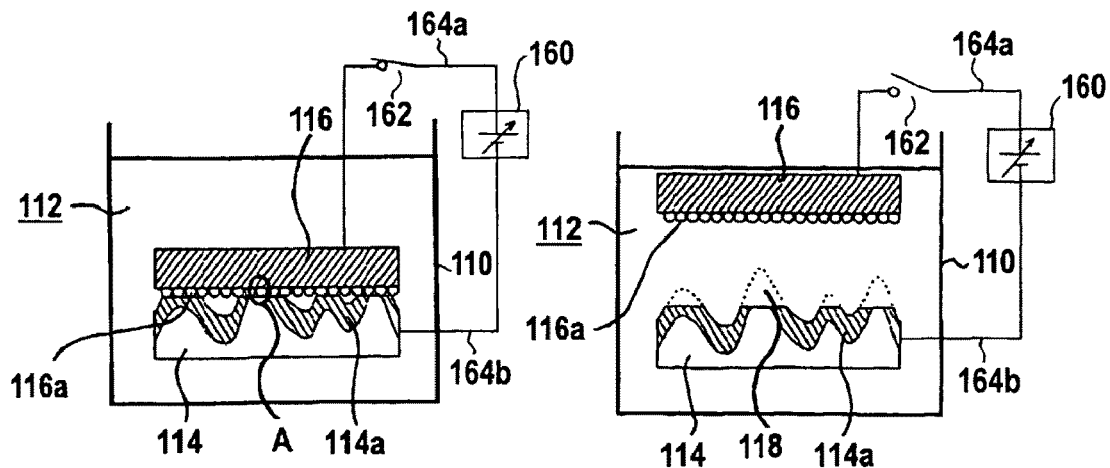

The surface of the acidic solid catalyst 116 is then brought into contact with the surface of the copper oxide 114a, e.g., at a pressure of about 0.01 to 5 kgf/cm$^2$, as shown in FIG. 33C, whereupon the copper oxide (CuO) 114a makes etching reaction with the hydrogen ions (H$^+$) 116a, generated at the surface the acidic solid catalyst 116, in the contact portions A with the acidic solid catalyst 116 and becomes copper ions (Cu$^{2+}$), as shown by the above-described chemical formula (3), and dissolves in the oxidizing processing liquid 112. The portions 118 of the copper oxide 114a, which have made contact with the surface of the acidic solid catalyst 116, have thus been removed, as shown in FIG. 33D. The surface of the copper workpiece 114 is processed in this manner.

It is, of course, possible also in the embodiment shown in FIGS. 32A through 32D to apply a voltage between the solid catalyst and the surface to be processed of the workpiece to promote oxidation of the surface to be processed.

As is known by the Arrhenius equation, the higher the reaction temperature of a chemical reaction is, the higher is the reaction rate. The present processing method is based on a chemical reaction. It is therefore possible to control the processing rate of a workpiece by controlling the reaction temperature of the chemical reaction. The reaction temperature can be controlled by controlling at least one of the temperature of the workpiece, the temperature of the oxidizing processing liquid and the temperature of the solid catalyst in the embodiment shown in FIGS. 28A through 28D, and at least one of the temperature of the workpiece, the temperature of the processing liquid and the temperature of the solid catalyst in the embodiment shown in FIGS. 32A through 32D.

A buffer solution may be added to the processing liquid. A buffer solution is a solution which, when added to the processing solution, prevents a change in the pH of the processing liquid. $Ga_2O_3$, an oxide of GaN, is soluble in an acidic or basic liquid. Accordingly, when carrying out processing of GaN, the processing liquid should be adjusted to a pH of about 7 in order to prevent dissolution of $Ga_2O_3$ in the processing liquid. The pH of the processing liquid can be adjusted by adding a buffer solution having an adjusted pH to the processing liquid.

Further, a buffer solution has the property of consuming $H^+$ ions or $OH^-$ ions generated. The use of a buffer solution can therefore shorten the survival time of $H^+$ ions or $OH^-$ ions. Thus, the use of a processing liquid, to which a buffer solution is added, makes it possible to allow $H^+$ ions or $OH^-$ ions to exist only in close proximity to a solid catalyst, thereby processing a workpiece more flatly.

Figure 34A:
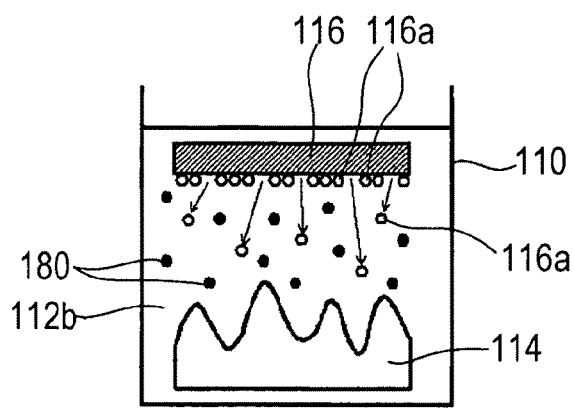
FIG. 34A through 34D illustrate the concept of processing of a workpiece using a processing liquid to which a buffer solution is added, with FIGS. 34A and 34B showing the state of a workpiece before processing, FIG. 34C showing the state of the workpiece when an acidic solid catalyst has been brought into contact with the workpiece, and FIG. 34D showing the state of the workpiece after processing.
Figure 34B:
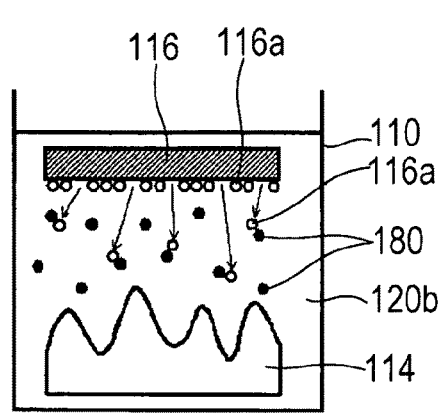
Figure 34C:
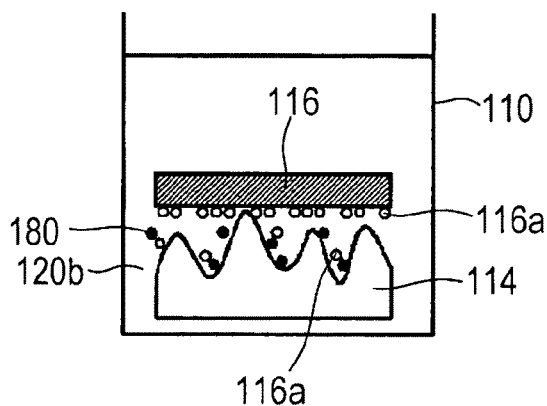
Figure 34D:
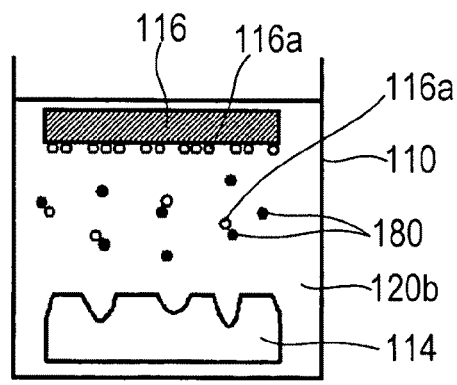

FIGS. 34A through 34D illustrate the concept of processing of a workpiece using a processing liquid to which a buffer solution is added. As shown in FIG. 34A, when an acidic solid catalyst 116 is immersed in a processing liquid 112b, hydrogen ions ($H^+$) 116a are generated at the surface of the acidic solid catalyst 116, and the hydrogen ions 116a leave the surface of the acidic solid catalyst 116. The processing liquid 112b, by the addition of the buffer solution, contains a dissolved buffering agent 180. The hydrogen ions 116a, which have left the surface of the acidic solid catalyst 116, rapidly react with the buffering agent 180 and become inactive, as shown in FIG. 34B. Thus, hydrogen ions 116a exist only on or in close proximity to the surface of the acidic solid catalyst 116 serving as a processing reference plane. When the acidic solid catalyst 116 is brought into contact with or close proximity to the surface to be processed of a workpiece 114 in the processing liquid 112b containing the buffering agent 180, as shown in FIG. 34C, surface atoms of the contact portions of the workpiece 114 are dissolved by chemical reaction in the processing liquid 112b. When the acidic solid catalyst 116 is separated from the surface to be processed of the workpiece 114, as shown in FIG. 34D, hydrogen ions 116a, generated at the surface of the acidic solid catalyst 116, do not act on the surface of the workpiece 114 any more whereby the dissolution reaction ceases. Thus, the surface to be processed of the workpiece 114 is processed only when the acidic solid catalyst 116 is in contact with or in close proximity to the surface to be processed of the workpiece 114.

When a buffer solution is not added to a processing liquid, i.e., when a buffering agent is not present in the processing liquid, hydrogen ions diffuse into the processing liquid even after they leave a surface of an acidic solid catalyst. Thus, hydrogen ions exist even in those places at a distance from the surface of the acidic solid catalyst. Accordingly, when the acidic solid catalyst is brought into contact with or close proximity to the surface to be processed of a workpiece in the processing liquid, surface atoms of the surface to be processed are dissolved in the processing liquid by a chemical reaction not only in the contact portions but also in those portions of the surface to be processed which are at a distance from the surface of the acidic solid catalyst. Thus, hydrogen ions will act not only on raised portions in the surface to be processed but also on recessed portions, whereby the surface to be processed will be processed isotropically and will not be flattened.

Figure 35:
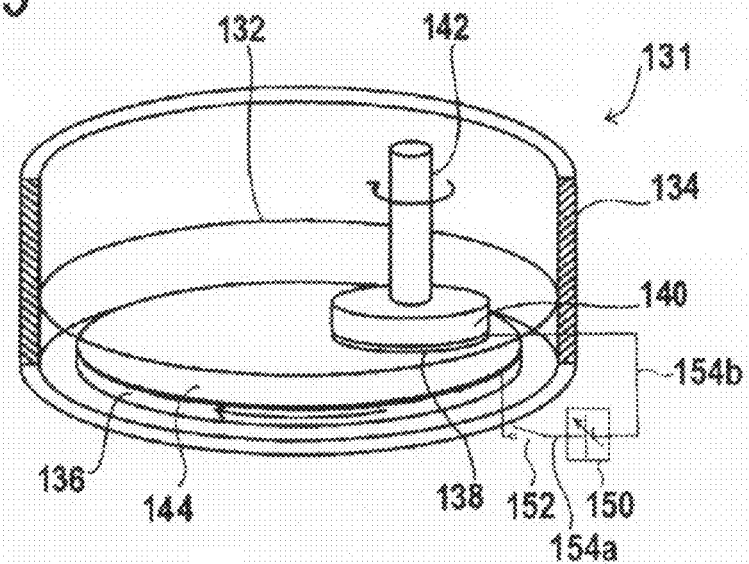
FIG. 35 is a schematic perspective view of a catalyst-aided chemical processing apparatus, adapted for use as a polishing apparatus, according to yet another embodiment of the present invention.

FIG. 35 shows a schematic perspective view of a catalyst-aided chemical processing apparatus, adapted for use as a polishing apparatus for processing of copper, according to yet another embodiment of the present invention. The polishing apparatus (catalyst-aided chemical processing apparatus) 131 includes a vessel 134 which is to be filled with an oxidizing processing liquid 132, for example, ozone water having a concentration of 2 ppm, a platen 136 rotatably disposed in the vessel 134, and a holder 140 for detachably holding a workpiece 138 with its front surface (surface to be processed) facing downwardly. A solid catalyst (acidic solid catalyst) 144 having an acidic nature is fixed on an upper surface of the platen 136. The holder 140 is composed of a material, such as SiC, having excellent processability, chemical resistance and temperature resistance, though it may also be composed of hard vinyl chloride or PEEK, and is coupled to the front end of a vertically-movable rotating shaft 142 provided parallel and eccentric to the rotation axis of the platen 136. The holder 140 is supported pivotably with respect to the rotating shaft 142 (via a ball bearing) so that the workpiece-holding face of the holder 40 can follow the surface of the platen 136 and the entire surface of the workpiece 138 can make contact with the platen 136.

The apparatus also includes a power source 150 whose anode and cathode are reversible. A conducting wire 154a extending from one pole of the power source 150 and having a switch 152 interposed therein is connected to the acidic solid catalyst 144, and a conducting wire 154b extending from the other pole of the power source 150 is connected to the workpiece 138.

As schematically shown in FIGS. 33A through 33D, it is also possible to provide a large number of light passing holes in the platen 136 and dispose a light source below the platen 136, and to irradiate the surface (surface to be processed) of the workpiece 138 with light (preferably ultraviolet light) whose wavelength is preferably not more than a wavelength which corresponds to the band gap of the workpiece 138.

In the case where such a light source is provided, it is also possible to use a processing liquid such as ultrapure water or oxygen water instead of the oxidizing processing liquid 132.

In operation, the vessel 134 is filled with the oxidizing processing liquid 132, for example, ozone water having a concentration of 2 ppm, and the acidic solid catalyst 144 and the workpiece 138 held by the holder 140 are rotated while pressing the workpiece 138 against the acidic solid catalyst 144 at a predetermined pressure, e.g., about 1 to 5 $kgf/cm^2$, to process and flatten the surface (lower surface) of the workpiece 138. During the processing, according to necessity, a predetermined voltage is applied between the acidic solid catalyst 144 and the workpiece 138 with the workpiece 138, for example, as an anode. In the case where the light source is provided, according to necessity, the surface (surface to be processed) of the workpiece 138 is irradiated with light having a predetermined wavelength.

Instead of the dip processing manner of immersing the acidic solid catalyst 144 and the workpiece 138 in the oxidizing processing liquid 132 that fills the vessel 134, it is also possible to supply the oxidizing processing liquid from a nozzle (not shown), disposed above the acidic solid catalyst 144, to between the acidic solid catalyst 144 and the workpiece 138. In the case where the oxidizing processing liquid is reused by circulation, it is preferred to purify the oxidizing processing liquid to remove sludge before reusing the processing liquid. It is also possible to use an apparatus having the vertically reverse structure to that shown in FIG. 35. Thus, a workpiece is disposed with its surface to be processed facing upwardly, and an acidic solid catalyst, facing the surface to be processed and disposed above the workpiece, is brought into light contact with or close proximity to the workpiece.

It is conceivable that part of copper ions that are removed during processing will be taken into the acidic solid catalyst. It is therefore preferred to carry out regeneration of the acidic solid catalyst when carrying out processing of a workpiece for a long period of time or carrying out processing of a plurality of workpieces successively. The regeneration of the acidic solid catalyst may preferably be carried out by discharge of ions with a chemical solution or by discharge of ions by application of electric field.

Example 10

Figure 36:
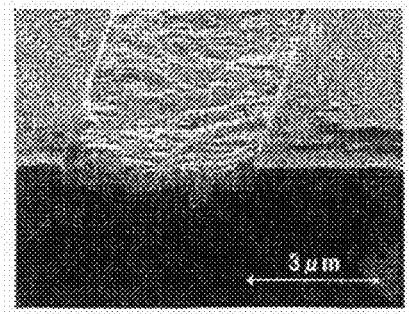
FIG. 36 is a photomicrograph of a processing sample after processing in Example 10.

Using the polishing apparatus shown in FIG. 35, processing of a surface copper plated film of a workpiece 138 was carried out for 60 minutes by bringing the surface of the workpiece 138, held by the holder 140, into contact with the acidic solid catalyst 144 while rotating the platen 136 at 60 rpm and rotating the holder 140 at 61 rpm. The workpiece 138 had been prepared by forming a copper plated film on an insulating film while filling the copper plated film into an interconnect pattern provided in the insulating film. FIG. 36 shows a perspective view of the workpiece after the processing. As shown in FIG. 36, the surface copper plated film of the workpiece was processed and removed without leaving a copper residue on the surface of the insulating film between interconnects. This is considered to be due to the fact that the present processing method is electroless processing, and thus the conductive properties of the base (insulating film) do not affect the processing characteristics.

Figure 37:
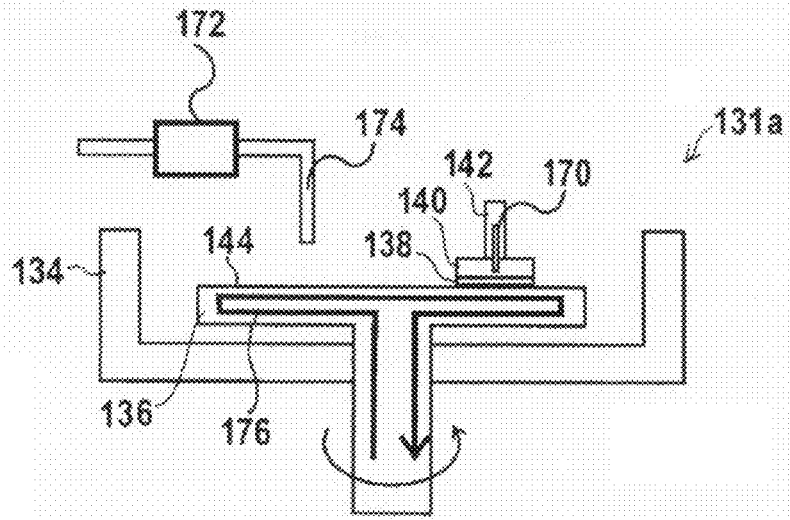
FIG. 37 is a schematic cross-sectional view of a catalyst-aided chemical processing apparatus, adapted for use as a polishing apparatus, according to yet another embodiment of the present invention.

FIG. 37 shows a schematic perspective view of a catalyst-aided chemical processing apparatus, adapted for use as a polishing apparatus, according to yet another embodiment of the present invention. The polishing apparatus (catalyst-aided chemical processing apparatus) 131a shown in FIG. 37 differs from the polishing apparatus (catalyst-aided chemical processing apparatus) 131 shown in FIG. 35 in the following respects: Embedded in the holder 140 and extending in the rotating shaft 142, there is provided a heater 170 as a temperature control mechanism for controlling the temperature of a workpiece 138 held by the holder 140. Above the vessel 134 is disposed a processing liquid supply nozzle 174 as a temperature control mechanism for supplying a processing liquid, whose temperature is controlled at a predetermined temperature by a heat exchanger 172, into the vessel 134. Further, a fluid passage 176 as a temperature control mechanism for controlling the temperature of the acidic solid catalyst 144 fixed on the platen 136 is provided in the interior of the platen 136.

Though, in this embodiment, are provided the heater 170 as a temperature control mechanism for controlling the temperature of the workpiece 138, the processing liquid supply nozzle 174 as a temperature control mechanism for controlling the temperature of the processing liquid, and the fluid passage 176 as a temperature control mechanism for controlling the temperature of the acidic solid catalyst 144, it is also possible to provide only one or two of them.

As is known by the Arrhenius equation, the higher the reaction temperature of a chemical reaction is, the higher is the reaction rate. According to this embodiment, the reaction temperature can be controlled by controlling at least one of the temperature of the workpiece 138, the temperature of the processing liquid and the temperature of the acidic solid catalyst 144, whereby the processing rate can be changed.

Figure 38:
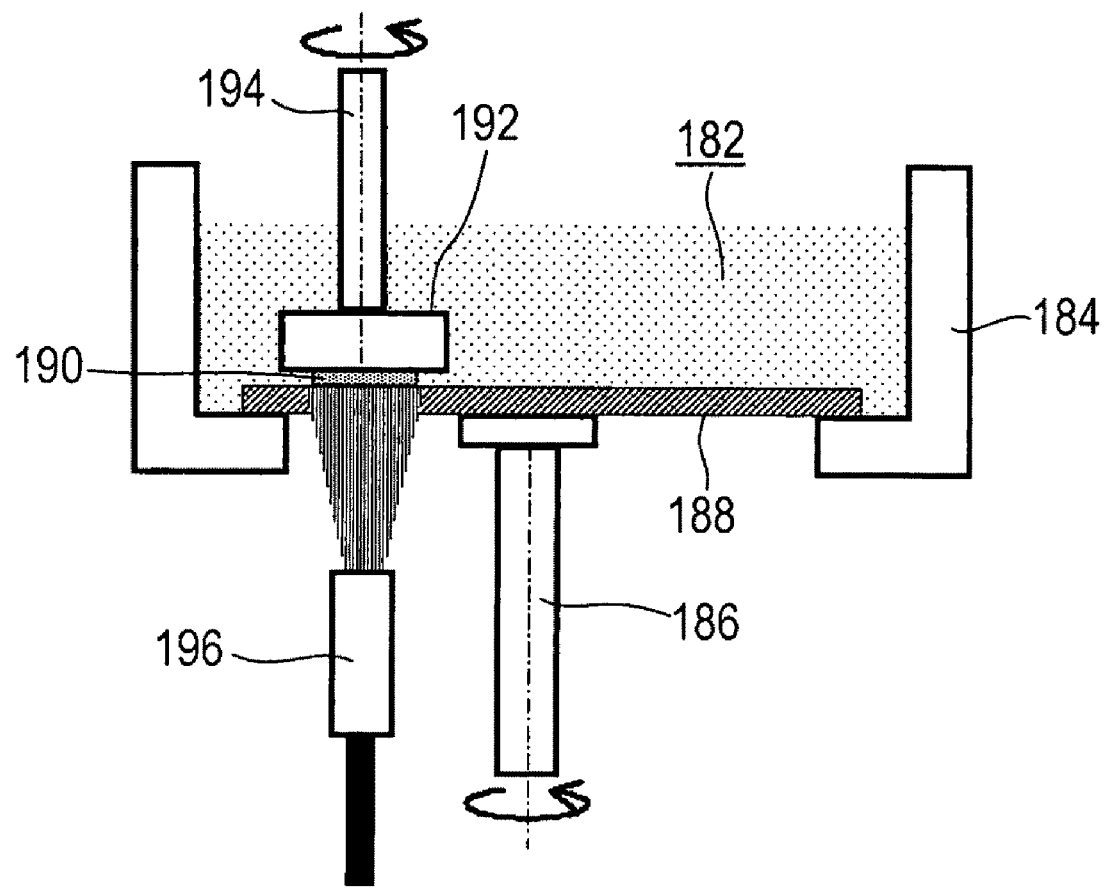
FIG. 38 is a schematic cross-sectional view of a catalyst-aided chemical processing apparatus, adapted for use as a polishing apparatus, according to yet another embodiment of the present invention.

FIG. 38 shows a catalyst-aided chemical processing apparatus, which is provided with a light source, adapted for use as a polishing apparatus, according to yet another embodiment of the present invention. The polishing apparatus (catalyst-aided chemical processing apparatus) includes a vessel 184 which is to be filled with a processing liquid 182 containing a buffering agent, a platen 188 coupled to the upper end of a rotating shaft 186 and rotatably disposed in the vessel 184, and a holder 192 for detachably holding a workpiece 190, such as a GaN substrate, with its surface to be processed facing downwardly. The holder 192 is secured to the lower end of a rotating shaft 194. A light source 196 is provided below the platen 188, and the platen 188 is composed of an acidic solid catalyst having good light transparency, such as quartz. Light, e.g., ultraviolet light, is emitted from the light source 196 and applied through the platen 188 to the lower surface (surface to be processed) of the workpiece 190. The platen 188 may also be composed of sapphire, zirconia, or the like, having good light transparency.

Example 11

Figure 39:
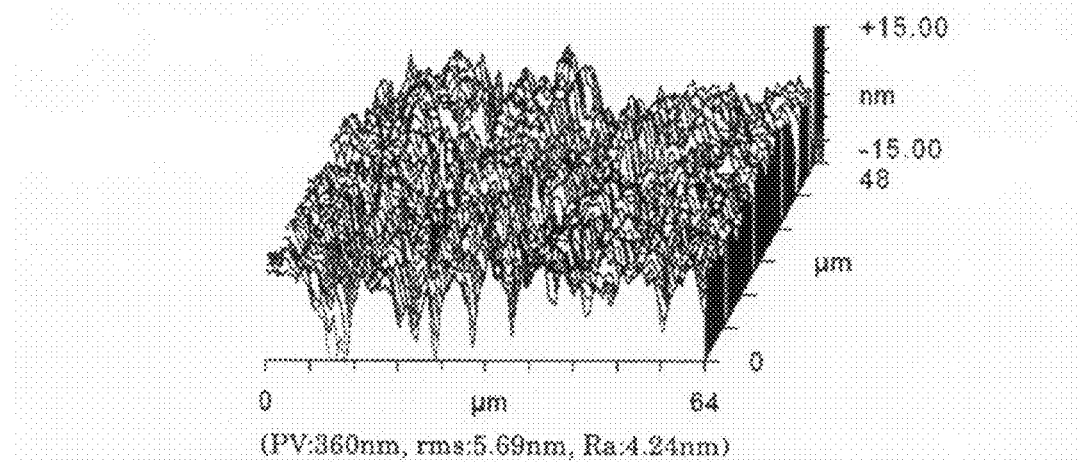
FIG. 39 shows a phase-shift interferometry microscope image of the surface of the sample before processing in Example 11.
Figure 40:
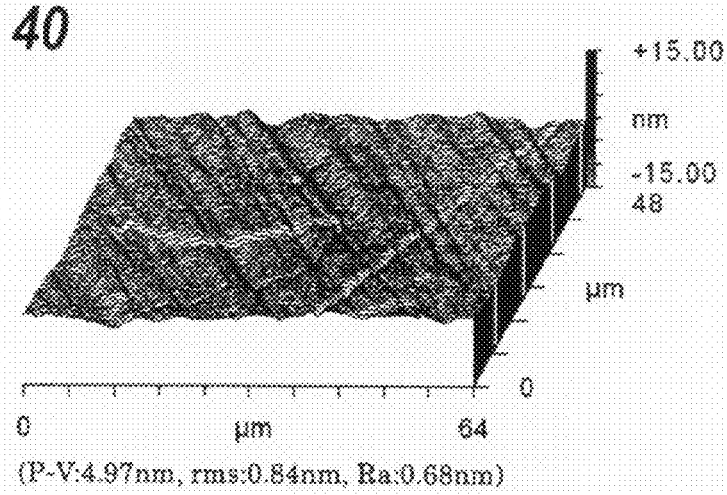
FIG. 40 shows a phase-shift interferometry microscope image of the surface of the sample after processing in Example 11.

Using the polishing apparatus shown in FIG. 38, processing of a GaN wafer sample was carried out. The processing was carried out for 3 hours using a phosphate buffer solution having a pH of 6.8 as a processing liquid. FIG. 39 shows a phase-shift interferometry microscope image of the surface of the sample before processing. The surface roughness of the sample, which has been produced in the preceding processing, can be observed in FIG. 39. FIG. 40 shows a phase-shift interferometry microscope image of the surface of the sample after processing.

Figure 41:
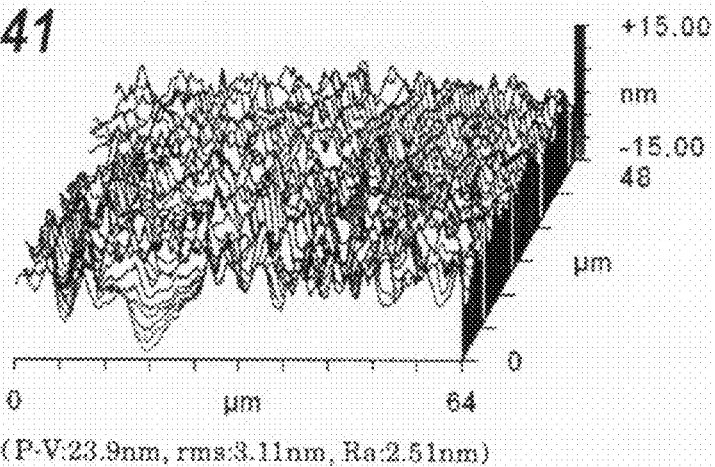
FIG. 41 shows a phase-shift interferometry microscope image of the surface of the sample after processing for reference.

For reference, processing of the same GaN wafer sample was carried out in the same manner as in Example 11 except for using ultrapure water as a processing liquid. FIG. 41 shows a phase-shift interferometry microscope image of the surface of the sample after processing.

As will be appreciated from comparison between FIG. 40 and FIG. 41, the surface roughness of the sample, processed with the use of the processing solution containing the buffering agent, is considerably smaller than the surface roughness of the sample processed with ultrapure water containing no buffering agent.

The second catalyst-aided chemical processing method of the present invention can be applied not only to uniaxial processing or two-dimensional processing but to various types of removal processing, including processing of a three-dimensional workpiece into a desired shape as by bringing a spherical or cylindrical catalyst into contact with the workpiece. The above-described voltage application, light irradiation and temperature control may be employed either singly or in a desired combination to promote processing.

The second catalyst-aided chemical processing method of the present invention employs an acidic or basic solid catalyst to make it serve as a processing reference plane, and progresses processing by oxidizing a surface to be processed either by the use of an oxidizing processing liquid or by irradiation of the surface to be processed with light (e.g., ultraviolet light), reacting the resulting oxide with an acid ($H^+$ ion) or a base ($OH^-$ ion) on the surface of the solid catalyst, and dissolving the reacted oxide in a processing liquid, such as an oxidizing processing liquid. According to the catalyst-aided chemical processing method of the present invention, a solid catalyst, which performs a catalytic function, is brought into contact with or close proximity to a surface to be processed in a processing liquid, such as an oxidizing processing liquid, without using abrasive grains or a polishing material, and the solid catalyst and the surface to be processed are moved relative to each other, whereby processing progresses while a new surface to be processed emerges continually. The solid catalyst exhibits an acidic or basic nature only at its surface, making it possible to process a workpiece in a spatially-controlled condition.

Because the second catalyst-aided chemical processing method of the present invention is a chemical processing method that utilizes a reference plane, highly effective processing and flattening of a surface to be processed having a space wavelength range of not less than several tens of $\mu m$, which has been difficult with EEM or plasma CVM, becomes possible. In addition, the present processing method makes it possible to process with high precision not only copper but also such materials as GaN which have heretofore been difficult to process. The present processing method can therefore be expected to be usable in semiconductor device manufacturing processes.

A description will now be made of a third catalyst-aided chemical processing method of the present invention.

The processing principle of the third catalyst-aided chemical processing method of the present invention consists in: putting a workpiece in a processing liquid containing an oxidizing agent; bringing a solid catalyst, capable of decomposing the oxidizing agent, into contact with or close proximity to a surface to be processed of a workpiece; and removing a compound from the workpiece or dissolving the compound in the processing liquid, the compound being formed by a chemical reaction between an active species having a strong oxidizing power, generated on the catalyst, and a surface atom of the workpiece, thereby processing the workpiece. To the processing is applied at least one of a light irradiation means for irradiating the surface to be processed of the workpiece with light during processing, a voltage application means for applying a voltage between the surface to be processed of the workpiece and the solid catalyst during processing, a solid catalyst temperature control means for controlling the temperature of the solid catalyst, a workpiece temperature control means for controlling the temperature of the workpiece, and a processing liquid temperature control means for controlling the temperature of the processing liquid. These means may be used either singly or in a combination of two or more. The third catalyst-aided chemical processing method of the present invention includes a manner in which a workpiece and a solid catalyst are immersed in a processing liquid, and a manner in which a flow of a processing liquid is supplied to the contact portion of a workpiece in contact with a solid catalyst.

Figure 42A:
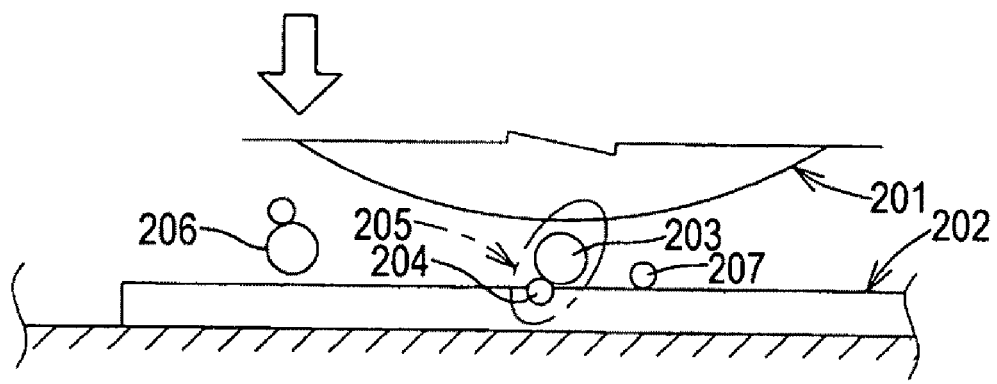
FIGS. 42A and 42B are conceptual diagrams illustrating a third catalyst-aided chemical processing method of the present invention, with FIG. 42A showing the state of a workpiece when active species are acting on a surface to be processed of the workpiece as a solid catalyst has been brought into close proximity to the workpiece in a processing liquid, FIG. 42B showing the state of the workpiece when the surface to be processed is being processed by the active species as the solid catalyst is leaving the workpiece.
Figure 42B:
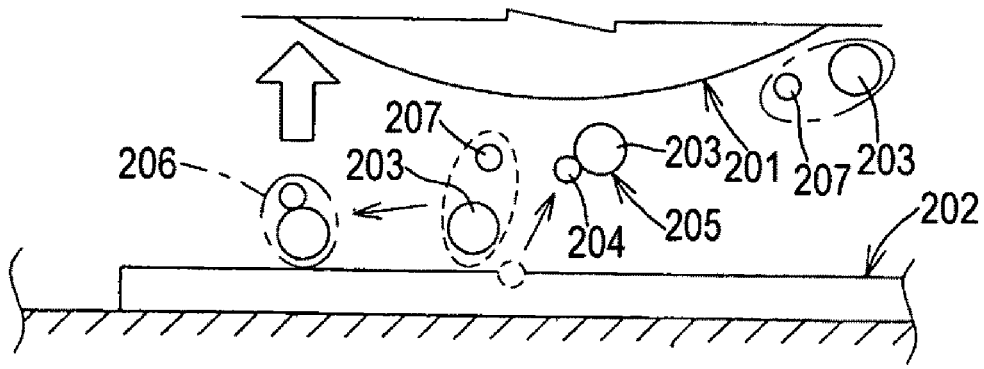

FIGS. 42A and 42B illustrate the concept of the third catalyst-aided chemical processing method of the present invention. As shown in FIG. 42A, when a solid catalyst 201 is brought into contact with or close proximity to a workpiece 202 in a processing liquid containing an oxidizing agent, an active species 203, generated at the surface of the solid catalyst 201, reacts with a surface atom 204 of the workpiece 202 to form a compound 205, while an oxidizing agent molecule 206 dissociates into an active species 203 and a residual molecule 207. When the solid catalyst 201 is then separated from the workpiece 202, the compound 205 is removed from the surface to be processed of the workpiece 202, while an unreacted active species 203 combines with a residual molecule 207 and becomes inactive, as shown in FIG. 42B. Thus, the workpiece 202 is processed only when the solid catalyst 201 is in contact with or close proximity to the workpiece 202. A light irradiation means, a voltage application means or a temperature control means, or a combination thereof is used in carrying out the processing.

$H_2O_2$ or $O_3$ may be used as the oxidizing agent. Examples of materials for the solid catalyst include transition metals such as Fe, Ni, Co, Cu, Cr and Ti, noble metals such as platinum and gold, metal oxide ceramics, a glass, such as quartz ($SiO_2$), sapphire ($Al_2O_3$) and zirconia ($ZrO_2$), and a basic solid catalyst. These materials may be used either singly or in a combination of two or more. The present method is intended to process a material generally hard to process, such as crystalline SiC, sintered SiC, GaN, sapphire, ruby, diamond, etc., though Si may, of course, be processed. It is most preferred to use $H_2O_2$ as the oxidizing agent and Fe for the solid catalyst, and process a workpiece composed of SiC, GaN or diamond by utilizing the Fenton reaction.

A stabilizer for stabilizing an oxidizing agent may be added to the processing liquid in order to control the decomposition rate of the oxidizing agent. Especially when $H_2O_2$ is used as an oxidizing agent and Pt as a catalyst, the reaction rate is so high that troublesome gas bubbles may grow during processing. The use of sodium silicate as a stabilizer can suppress the decomposition reaction of hydrogen peroxide, thereby preventing the growth of such gas bubbles. The catalytic reaction can thus be retarded by adding a stabilizer to the processing liquid.

It is also possible to disperse the solid catalyst in a powdery form in the processing liquid containing an oxidizing agent, and supply the powdery solid catalyst to a surface to be processed of a workpiece by a flow of the processing liquid to process the surface to be processed.

The processing principle of the third catalyst-aided chemical processing method of the present invention will now be described in greater detail. A description will be first given of the generation of active species at a surface of a solid catalyst. As shown by the below-described reaction formulae, in the catalytic decomposition process of hydrogen peroxide or ozone, hydroxyl radical (represented by ".OH" in the reaction formula) or oxygen atom (represented by ".O." in the reaction formula), which are both an active species having a strong oxidizing power, is generated. Such active species react with surrounding molecules to form inactive molecules as soon as the species leave the catalyst. This makes it possible to carry out processing of a workpiece with a surface of a solid catalyst as a reference plane by bringing the workpiece into contact with or close proximity to the surface of the solid catalyst.

<Decomposition Reaction of Hydrogen Peroxide>

Figure 43:
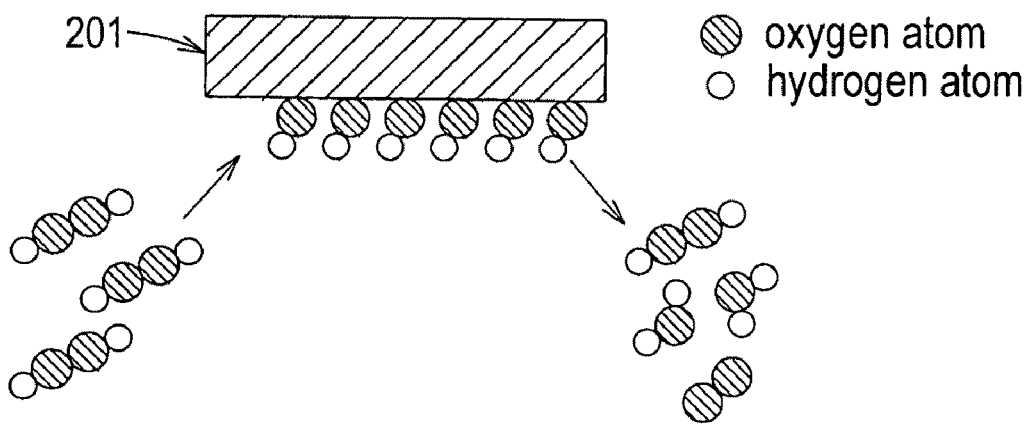
FIG. 43 is a diagram illustrating the catalytic decomposition reaction of hydrogen peroxide.

Hydrogen peroxide is decomposed to generate hydroxyl radicals in accordance with the following reaction formula (7) at a surface of a solid catalyst such as platinum, gold or a basic solid catalyst, as shown in FIG. 43.

$$H_2O_2 \rightarrow \cdot OH + \cdot OH \tag{7}$$

When using a transition metal (such as Fe, Ni, Co, Cu, Cr or Ti) as a solid catalyst, hydroxyl radicals are considered to be generated in accordance with the following reaction formula (8):

$$M + nH_2O_2 \rightarrow M^{n+} + n \cdot OH + nOH^- \tag{8}$$

Though the transition metal as a catalyst is considered to be ionized and dissolved in the solution, the amount of the dissolved metal is so small that the surface of the catalyst little changes. The hydroxyl radicals have a strong oxidizing power and are highly active, and are reactive even with chemically stable materials, such as SiC, GaN and diamond, and thus can be used for processing of such materials. Hydroxyl radicals, which have left the surface of the catalyst, will react with each other to return to hydrogen peroxide molecules, and will also react with water molecules or dissolved oxygen in the solution. The hydroxyl radicals thus lose their activity, and are finally decomposed into water molecules and oxygen molecules. Hydrogen peroxide molecules and oxygen molecules are inactive as compared to hydroxyl radicals, and do not react with the above-described chemically stable materials.

<Decomposition Reaction of Ozone>

Figure 44:
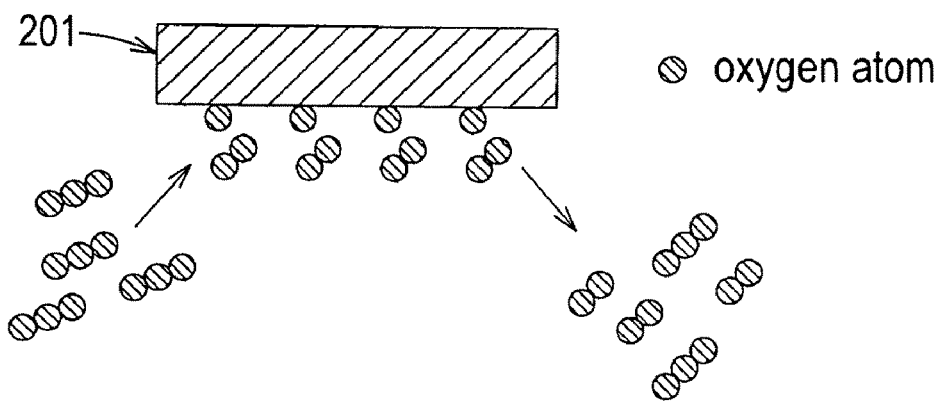
FIG. 44 is a diagram illustrating the catalytic decomposition reaction of ozone.

Ozone molecules are decomposed into oxygen molecules and oxygen atoms in accordance with the following reaction formula (9) at a surface of a solid catalyst such as a metal oxide ceramic or a basic solid catalyst (ion-exchange material), as shown in FIG. 44.

$$O_3 \rightarrow O_2 + \cdot O \tag{9}$$

The oxygen atoms have a strong oxidizing power and are highly active, and are reactive even with chemically stable materials, such as SiC, GaN and diamond, and thus can be used for processing of such materials.

Oxygen atoms which have left the surface of the catalyst will either react with oxygen atoms in the solution to form ozone molecules, as shown by the following reaction formula (10), or react with each other to form oxygen molecules, as shown by the following reaction formula (11):

$$\cdot O + O_2 \rightarrow O_3 \tag{10}$$

$$\cdot O + \cdot O \rightarrow O_2 \tag{11}$$

Ozone molecules and oxygen molecules are inactive as compared to oxygen atoms, and do not react with the above-described chemically stable materials.

<Reaction of Active Species with Workpiece>

When processing a workpiece composed of SiC, a SiC surface is considered to be oxidized either by hydroxyl radicals in accordance with the following reaction formula (12) or by oxygen atoms in accordance with the following reaction formula (13), and the oxidized portion will be processed preferentially:

$$SiC + 4 \cdot OH + O_2 \rightarrow SiO_2 + 2H_2O + CO_2 \uparrow \tag{12}$$

$$SiC + 4 \cdot O \rightarrow SiO_2 + CO_2 \uparrow \tag{13}$$

When processing a workpiece composed of GaN, a GaN surface is considered to be oxidized either by hydroxyl radicals in accordance with the following reaction formula (14) or by oxygen atoms in accordance with the following reaction formula (15), and the oxidized portion will be processed preferentially:

$$2GaN + 7 \cdot OH + 7/4 O_2 \rightarrow Ga_2O_3 + 7/2 H_2O + 2NO_2 \uparrow \tag{14}$$

$$2GaN + 7 \cdot O \rightarrow Ga_2O_3 + 2NO_2 \uparrow \tag{15}$$

<Increase in Processing Rate by Light Irradiation>

Wide band gap materials, such as SiC and GaN, are very stable chemically, and therefore it is difficult to obtain a sufficient processing rate for such a material even when utilizing the action of hydroxyl radicals or oxygen atoms. By irradiating such a workpiece with light, which corresponds to the band gap of the workpiece, during reaction, the surface of the workpiece can be activated, thereby increasing the processing rate. As shown in FIG. 45A, irradiation of a workpiece 210 with an excitation light is carried out by disposing an excitation light source 212 behind a solid catalyst 211, and passing an excitation light through an excitation light transmissive window 213 which is transparent to the excitation light and applying the excitation light from the back of the solid catalyst 211 to the workpiece 210. Quartz (SiO$_2$), sapphire (Al$_2$O$_3$) or CaF$_2$ is preferably used as a material for the excitation light transmissive window 213. When a material, which is not transparent to the excitation light, is used for the solid catalyst 211, a plurality of through-holes 214 is provided in the solid catalyst 211 so as to pass the excitation light therethrough and irradiate the surface to be processed of the workpiece 210 with the excitation light. The wavelength of the irradiating excitation light is preferably not more than a wavelength which corresponds to the band gap of the workpiece, for example, not more than 383 nm when processing SiC, because the band gap of 4H—SiC is 3.26 eV, and not more than 365 nm when processing GaN, because the band gap of GaN is 3.42 eV.

When the solid catalyst 211 is brought into proximity to the surface to be processed of the workpiece 210 while irradiating the surface to be processed with an excitation light 217, as shown in FIG. 45B, an activated region 215 in the surface to be processed of the workpiece 210 is processed by active species 216 generated in the vicinity of the surface of the solid catalyst 211, as shown in FIG. 45C. The processing stops when the solid catalyst 211 is separated from the workpiece 210, as shown in FIG. 45D. Raised portions of the surface to be processed of the workpiece 210 are thus preferentially processed and flattened according to the flatness of the surface of the solid catalyst 211.

Figure 46:
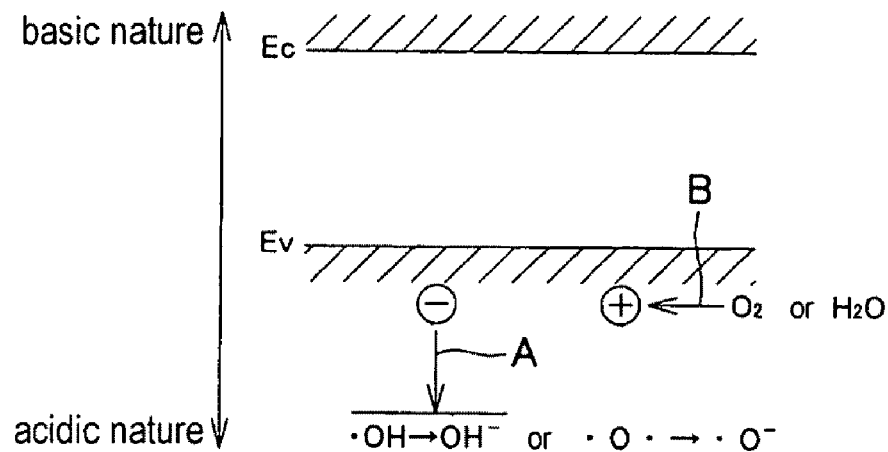
FIG. 46 is a diagram illustrating a reaction process which occurs when a hydroxyl radical or an oxygen atom acts on SiC.

For processing of a wide gap material by chemical reaction, it is generally necessary to draw out an electron from the valence band (Ev) to thereby form a hole (represented by h$^+$). The oxidizing power of a hydroxyl radical or an oxygen atom is stronger than the valence band potential of SiC. Therefore, when hydroxyl radicals or oxygen atoms act on a SiC surface, an electron is drawn out from the valence band of SiC and a hole is formed in accordance with the below-described reaction formula (16) or (17) (process A of FIG. 46). Water molecules or dissolved oxygen in the processing liquid will then act on such holes whereby processing of SiC occurs (process B of FIG. 46).

$$\cdot OH \rightarrow OH^- + h^+ \tag{16}$$

$$\cdot O \rightarrow \cdot O^- + h^+ \tag{17}$$

Figure 47:
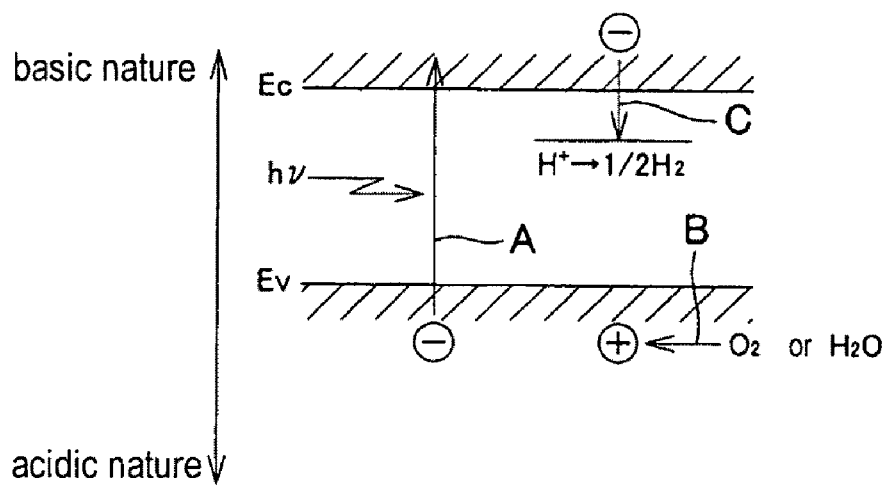
FIG. 47 is a diagram illustrating an oxidation process of SiC which occurs when it is irradiated with an excitation light.
Figure 48:
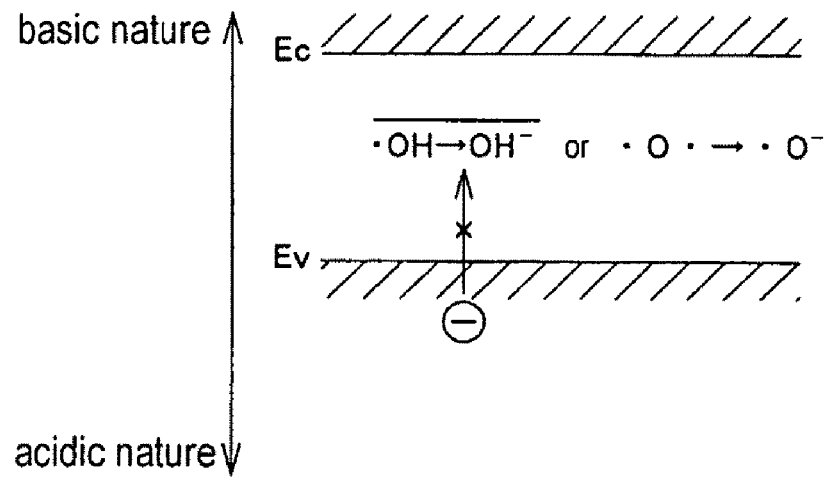
FIG. 48 is a diagram illustrating a reaction process which occurs when a hydroxyl radical or an oxygen atom acts on GaN.

When the surface of the workpiece is irradiated with an excitation light, having a wavelength which is not more than the wavelength (383 nm) corresponding to the band gap of the workpiece, during the reaction, an electron that exists in the valence band is excited and moved into the conduction band, whereby a hole is formed (process A of FIG. 47). Water molecules or dissolved oxygen in the processing liquid will then act on such holes whereby processing of SiC occurs (process B of FIG. 47). Electrons, which have been excited and moved to the workpiece, react with hydrogen ions in the processing liquid to form hydrogen molecules, and are thus consumed (process C of FIG. 48). The processing rate can be increased by carrying out these reaction processes and the above-described processing with active species simultaneously.

Consider now the case where hydroxyl radicals or oxygen atoms act on GaN. The oxidizing power of a hydroxyl radical or an oxygen atom is weaker than the valence band potential of GaN. Therefore, when hydroxyl radicals or oxygen atoms act on a GaN surface, an electron cannot be drawn out of the valence band of GaN. Accordingly, the above-described reaction will not occur (see FIG. 48).

Figure 49:
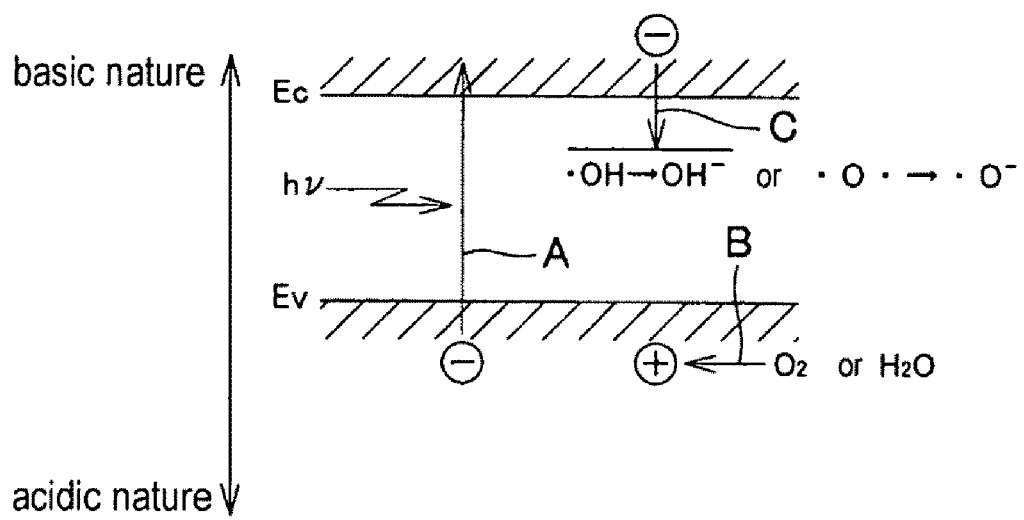
FIG. 49 is a diagram illustrating an oxidation process of GaN which occurs when it is irradiated with an excitation light.

When the surface of the workpiece is irradiated with an excitation light, having a wavelength which is not more than the wavelength (365 nm) corresponding to the band gap of the workpiece, during the reaction, an electron that exists in the valence band (Ev) is excited and moved into the conduction band whereby a hole is formed (process A of FIG. 49). Water molecules or dissolved oxygen in the processing liquid will then act on such holes whereby GaN is processed (process B of FIG. 49). On the other hand, excited electrons in the conduction band react with hydroxyl radicals or oxygen atoms, and are thus consumed (process C of FIG. 49).

In the case of absence of hydroxyl radicals or oxygen atoms which act on a GaN surface, because of the lower oxidizing power of the oxidizing agent than the conduction band potential, excited electrons cannot be consumed. In this case, therefore, the reaction of the process B of FIG. 49 does not proceed, while recombination of an excited electron with a hole occurs. Thus, processing of the GaN surface does not progress. In summary, processing of GaN progresses when the surface of the workpiece is irradiated with an excited light to excite the surface, and hydroxyl radicals or oxygen atoms are caused to act on the surface of the workpiece while allowing excited electrons to be consumed.

<Increase in Processing Rate by Voltage Application>

Figure 50:
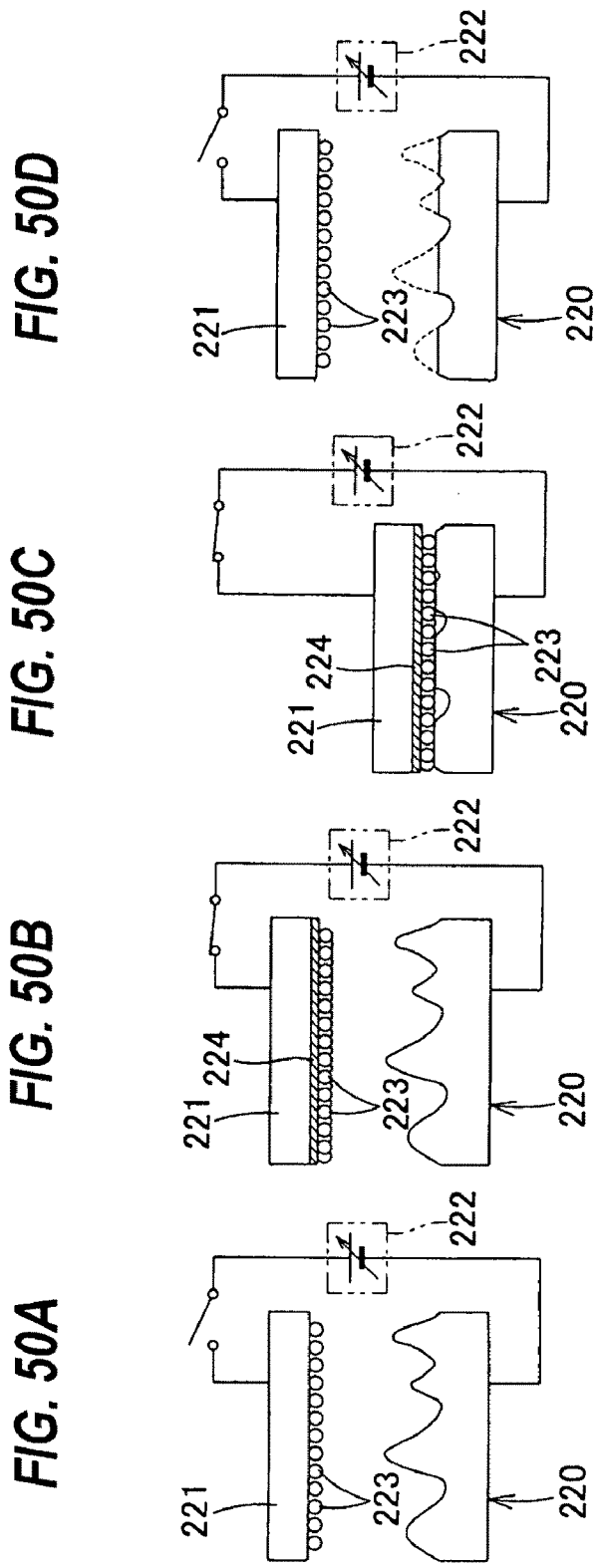
FIGS. 50A through 50D are conceptual diagrams illustrating the third catalyst-aided chemical processing method of the present invention utilizing application of a voltage between a workpiece and a solid catalyst, with FIG. 50A showing the state of the workpiece before processing, FIG. 50B showing the state of the workpiece during voltage application, FIG. 50C showing the state of the workpiece during processing, and FIG. 50D showing the state of the workpiece after processing.

When processing of a workpiece is carried out solely by utilizing a catalytic decomposition reaction, it is not possible to control the reaction rate, making it difficult to increase the processing rate. It becomes possible to promote the decomposition reaction of an oxidizing agent by connecting a direct-current power source 222 to a workpiece 220 and a solid catalyst 221, as shown in FIG. 50A, and applying a voltage between the workpiece 220 and the solid catalyst 221 so as to activate the surface of the solid catalyst 221, as shown in FIG. 50B. In particular, as shown in FIG. 50B, an activated region 224 is created in the surface of the solid catalyst 221 to increase active species 223. When the solid catalyst 221 is brought into proximity to the workpiece 220, as shown in FIG. 50C, raised portions of the surface to be processed of the workpiece 220 are preferentially processed, so that the surface to be processed is flattened, as shown in FIG. 50D, according to the flatness of the surface of the solid catalyst 221.

The decomposition reaction of $H_2O_2$ with a transition metal, in particular, is the one-electron reduction reaction of $H_2O_2$ molecule, shown by the following reaction formula (18) (Haber-Weiss reaction), at the surface of the catalyst:

$$H_2O_2 + e^- \rightarrow OH^- + \cdot OH \tag{18}$$

The decomposition reaction rate can be increased by applying such a voltage as to make the potential of the catalyst negative. The increase in the reaction rate leads to generation of a larger amount of active species at the surface of the catalyst, resulting in increased processing rate of the workpiece.

<Control of Processing Rate by Temperature Control>

As is known by the Arrhenius equation, the higher the reaction temperature of a chemical reaction is, the higher is the reaction rate. The present processing method is based on a chemical reaction. It is, therefore, considered possible to control or change the processing rate of a workpiece by controlling at least one of the temperature of the solid catalyst, the temperature of the workpiece and the temperature of the processing liquid. The rate of generation of active species can be controlled by controlling the temperature of the solid catalyst. The rate of reaction between surface atoms of the workpiece and active species can be controlled by controlling the temperature of the workpiece.

Figure 51:
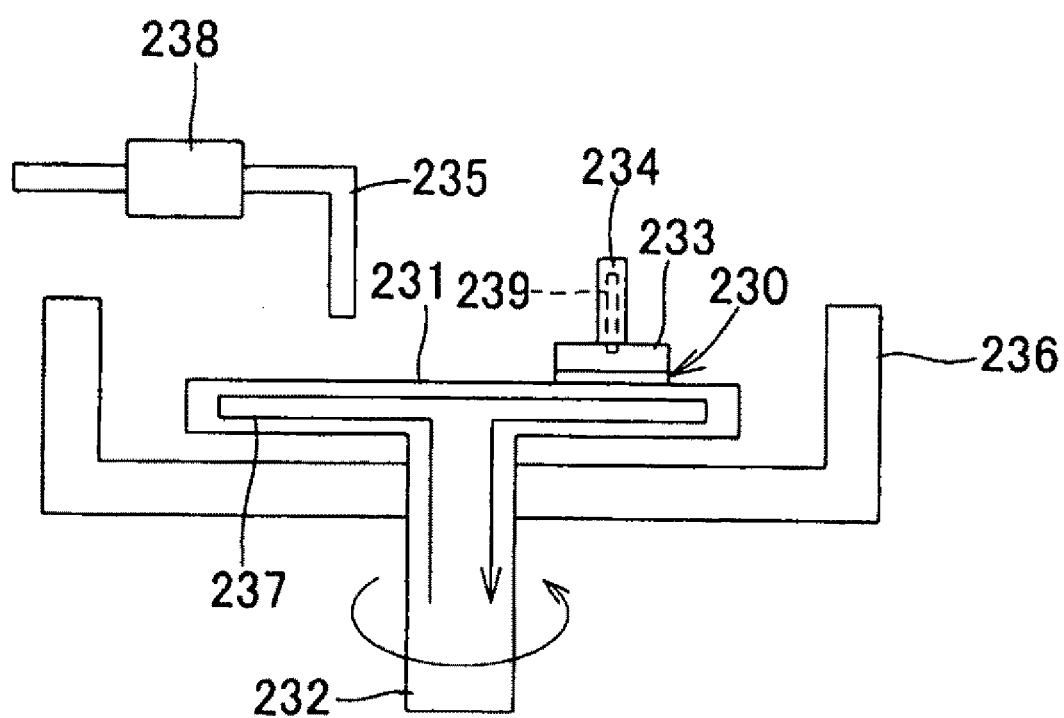
FIG. 51 is a schematic cross-sectional view of a catalyst-aided chemical processing apparatus having a temperature control function.

FIG. 51 shows a processing apparatus which includes a flat rotary platen 231 having a surface solid catalyst capable of decomposing an oxidizing agent, and a holder 233 having a rotating shaft 234 eccentric to the rotating shaft 232 of the platen 231. A surface to be processed of a workpiece 230, held by the holder 233, is processed and flattened by supplying a processing liquid containing the oxidizing agent from a supply nozzle 235 to between the surface of the catalyst and the surface to be processed of the workpiece 230, and rotating the platen 231 and the workpiece 230 while pressing the workpiece 230 against the platen 231 at a predetermined pressure. The rotary platen 231 is provided in a vessel 231 so that the processing liquid can be recovered. A flow passage 237 is provided in the interior of the rotary platen 231 and a temperature-controlled fluid is circulated in the flow passage 237 so that the surface temperature of the rotary platen 231, i.e., the temperature of the solid catalyst, can be controlled.

Embedded in the holder 233 and extending in the rotating shaft 234, there is provided a heater 239 as a temperature control mechanism for controlling the temperature of the workpiece 230 held by the holder 233. Further, the supply nozzle 235 is provided with a heat exchanger 238 so that the processing liquid, whose temperature is controlled at a predetermined temperature, can be supplied into the vessel 236. Though, in this embodiment, are provided the heater 239 as a temperature control mechanism for controlling the temperature of the workpiece 230, the supply nozzle 235 as a temperature control mechanism for controlling the temperature of the processing liquid, and the fluid passage 237 as a temperature control mechanism for controlling the temperature of the rotary platen 231, it is also possible to provide only one or two of them.

The above-described voltage application means, light irradiation means and temperature control means may be employed either singly or in a desired combination to promote processing.

The third catalyst-aided chemical processing method of the present invention employs a solid catalyst, which is capable of decomposing an oxidizing agent, to make it serve as a processing reference plane, and processes a workpiece by generating active species from the oxidizing agent at the surface of the catalyst, and removing or dissolving a compound formed by a chemical reaction between the active species and a surface atom of the workpiece in contact with or close proximity to the catalyst. According to the third catalyst-aided chemical processing method of the present invention, a solid catalyst is brought into contact with or close proximity to a surface to be processed of a workpiece in a processing liquid containing an oxidizing agent, and an oxide, formed in the surface to be processed by a chemical reaction between active species and surface atoms of the workpiece, is removed, whereby processing progresses without the use of abrasive grains or a polishing material while a new surface to be processed emerges continually. The active species generated at the surface of the catalyst rapidly become inactive as they leave the catalyst surface. Thus, the active species exist only on or in the vicinity of the catalyst surface serving as a reference plane. This makes it possible to process a workpiece in a spatially-controlled condition.

The third catalyst-aided chemical processing method of the present invention employs at least one of a light irradiation means for irradiating the surface to be processed of a workpiece with light during processing, a voltage application means for applying a voltage between the surface to be processed of a workpiece and a solid catalyst during processing, and a temperature control means for controlling the temperature of a catalyst, the temperature of a workpiece and/or the temperature of a processing liquid, which means may be used either singly or in a combination of two or more, in carrying out processing of the surface to be processed. This makes it possible to promote a chemical reaction involved in processing, thereby increasing the processing rate. It also becomes possible to chemically process wide band gap materials, such as SiC and GaN, which have heretofore been very difficult to process, at a practical level and to process sapphire, ruby and diamond with high precision. The present processing method can therefore be expected to be usable in semiconductor device manufacturing processes. The present processing method is advantageous especially in that $H_2O_2$ and $O_3$, which are easy to handle and inexpensive, can be used as an oxidizing agent. Thus, a considerable reduction in the processing cost can be made as compared to a method that uses HF.

The above-described embodiment of the third catalyst-aided chemical processing method, shown in FIG. 51, comprises: providing a flat rotary platen having a surface solid catalyst capable of decomposing an oxidizing agent, and a holder having a rotating shaft eccentric to the rotating shaft of the platen; supplying a processing liquid containing the oxidizing agent between the surface of the catalyst and a surface to be processed of a workpiece held by the holder; and rotating the platen and the workpiece while pressing the workpiece against the platen at a predetermined pressure, thereby processing and flattening the surface to be processed of the workpiece. Because this method is a chemical processing method that utilizes a reference plane, highly effective processing and flattening of a surface to be processed having a space wavelength range of not less than several tens of μm, which has been difficult with EEM or plasma CVM, becomes possible.

While the present invention has been described with reference to the preferred embodiments thereof, it is understood that the present invention is not limited to the particular embodiments, but various modifications may be made therein within the technical concept of the invention.

What is claimed is:

1. A catalyst-aided chemical processing method comprising:
    preparing a processing reference plane comprising a solid catalyst of platinum, gold, a ceramic solid catalyst, molybdenum, or a molybdenum compound;
    immersing a workpiece in a processing liquid in which halogen-containing molecules are dissolved;
    immersing the processing reference plane in the processing liquid so that halogen radicals are generated at the processing reference plane by dissociating the halogen-containing molecules;
    bringing the processing reference plane into contact with, or close proximity to, a surface to be processed of the workpiece, thereby processing the surface to be processed of the workpiece by dissolving surface atoms of the workpiece through a chemical reaction, between the halogen radicals generated at the processing reference plane and the surface atoms of the workpiece, that forms halogen compounds in the processing liquid; and
    at least one of (a) voltage application process of applying a voltage between the surface to be processed of the workpiece and the solid catalyst during the processing, (b) a light irradiation process of irradiating the surface to be processed of the workpiece with light during or before the processing, (c) a workpiece temperature control process of controlling temperature of the workpiece during the processing, (d) a processing liquid temperature control process of controlling a temperature of the processing liquid during the processing, and (e) a catalyst temperature control process of controlling a temperature of the solid catalyst during the processing.

2. A catalyst-aided chemical processing method comprising:
    preparing a processing reference plane comprising a solid catalyst having an acidic or basic nature;
    immersing a workpiece in an oxidizing processing liquid to form oxides on a surface to be processed of the workpiece;
    immersing the processing reference plane in the oxidizing processing liquid so that hydrogen ions ($H^+$) or hydroxide ions ($OH^-$) are generated at the processing reference plane; and
    bringing the processing reference plane into contact with, or close proximity to, the surface to be processed of the workpiece, thereby processing the surface of the workpiece by dissolving surface atoms of the workpiece through a chemical reaction, between the hydrogen ions ($H^+$) or hydroxide ions ($OH^-$) generated at the processing reference plane and the oxides formed on the surface to be processed of the workpiece, that forms metal ions in the oxidizing processing liquid.

3. The catalyst-aided chemical processing method according to claim 2, wherein the oxidizing processing liquid is ozone water or a hydrogen peroxide solution.

4. The catalyst-aided chemical processing method according to claim 2, further comprising irradiating the surface to be processed of the workpiece is with light during or before the processing of the workpiece.

5. The catalyst-aided chemical processing method according to claim 2, further comprising controlling at least one of (a) a temperature of the workpiece, (b) a temperature of the oxidizing processing liquid, and (c) a temperature of the solid catalyst, during the processing of the workpiece.

6. The catalyst-aided chemical processing method according to claim 2, further comprising applying a voltage between the surface to be processed of the workpiece and the solid catalyst during the processing of the workpiece.

7. The catalyst-aided chemical processing method according to claim 2, wherein the solid catalyst is a non-woven fabric, a resin, or a metal, having an ion exchange function.

8. The catalyst-aided chemical processing method according to claim 2, wherein the solid catalyst is a metal oxide having an acidic or basic nature.

9. A catalyst-aided chemical processing method comprising:
- preparing a processing reference plane comprising a solid catalyst having an acidic or basic nature;
- immersing a workpiece in a processing liquid;
- irradiating a surface to be processed of the workpiece with light to form oxides in the surface of the workpiece;
- immersing the processing reference plane in the processing liquid so that hydrogen ions ($H^+$) or hydroxide ions ($OH^-$) are generated at the processing reference plane; and
- bringing the processing reference plane into contact with, or close proximity to, the surface to be processed of the workpiece, thereby processing the surface to be processed of the workpiece by dissolving surface atoms of the workpiece through a chemical reaction, between the hydrogen ions ($H^+$) or the hydroxide ions ($OH^-$) generated at the Processing reference plane and the oxides formed in the surface to be processed of the workpiece, that forms metal ions in the processing liquid.

10. The catalyst-aided chemical processing method according to claim 9, further comprising controlling at least one of (a) a temperature of the workpiece, (b) temperature of the processing liquid, and (c) a temperature of the solid catalyst, during the processing of the workpiece.

11. The catalyst-aided chemical processing method according to claim 9, further comprising applying a voltage between the surface to be processed of the workpiece and the solid catalyst during the processing of the workpiece.

12. The catalyst-aided chemical processing method according to claim 9, wherein the solid catalyst is a nonwoven fabric, a resin or a metal, having an ion exchange function.

13. The catalyst-aided chemical processing method according to claim 9, wherein the solid catalyst is a metal oxide having an acidic or basic nature.

14. A catalyst-aided chemical processing method comprising:
- preparing a processing reference plane comprising a solid catalyst capable of decomposing an oxidizing agent;
- immersing a workpiece in a processing liquid containing the oxidizing agent;
- immersing the processing reference plane in the processing liquid to generate an active species having an oxidizing power at the processing reference plane;
- bringing the processing reference plane into contact with, or close proximity to, the surface to be processed of the workpiece, thereby processing the surface to be processed of the workpiece through a chemical reaction, between the active species generated at the processing reference plane and a surface atom of the workpiece, that removes or dissolves the surface atom from the surface of the workpiece by forming a compound in the processing solution; and
- at least one of (a) irradiating, with a light irradiation means, the surface to be processed of the workpiece with light during the processing, (b) applying, with a voltage application means, a voltage between the surface to be processed of the workpiece and the solid catalyst during the processing, (c) controlling, with a catalyst temperature control means, a temperature of the solid catalyst during the processing, (d) controlling, with a workpiece temperature control means, a temperature of the workpiece during the processing, and (e) controlling, with a processing liquid temperature control means, a temperature of the processing liquid during the processing.

15. The catalyst-aided chemical processing method according to claim 14, further comprising adding a stabilizer for stabilizing the oxidizing agent to the processing liquid to control a decomposition rate of the oxidizing agent.

16. The catalyst-aided chemical processing method according to claim 14, wherein the oxidizing agent is $H_2O_2$ or $O_3$.

17. The catalyst-aided chemical processing method according to claim 14, wherein the solid catalyst is a transition metal a noble metal, a metal oxide ceramic, a glass, or a basic solid catalyst, or a combination thereof, wherein the transition metal is selected from the group consisting of Fe, Ni, Co, Cu, Cr and Ti, and the noble metal is selected from the group consisting of platinum and gold.

18. The catalyst-aided chemical processing method according to claim 14, wherein the workpiece comprises crystalline SiC, sintered SiC, GaN, sapphire, ruby or diamond.

19. The catalyst-aided chemical processing method according to claim 14, wherein the oxidizing agent is $H_2O_2$, the solid catalyst is Fe, and the workpiece comprises SiC, GaN or diamond, and the processing is carried out by utilizing a Fenton reaction.

20. The catalyst-aided chemical processing method according to claim 15, wherein the oxidizing agent is $H_2O_2$ and the stabilizer is sodium silicate.

* * * * *